(12) United States Patent
Kagawa

(10) Patent No.: US 8,952,273 B2
(45) Date of Patent: Feb. 10, 2015

(54) NEAR-FIELD NOISE SUPPRESSION SHEET

(76) Inventor: Seiji Kagawa, Koshigaya (JP)

( * ) Notice: Subject to any disclaimer, the term of this patent is extended or adjusted under 35 U.S.C. 154(b) by 29 days.

(21) Appl. No.: 13/978,848

(22) PCT Filed: Nov. 14, 2011

(86) PCT No.: PCT/JP2011/076196
§ 371 (c)(1),
(2), (4) Date: Jul. 9, 2013

(87) PCT Pub. No.: WO2012/114587
PCT Pub. Date: Aug. 30, 2012

(65) Prior Publication Data
US 2013/0284511 A1   Oct. 31, 2013

(30) Foreign Application Priority Data

Feb. 25, 2011  (JP) ................. 2011-040977

(51) Int. Cl.
| | | |
|---|---|---|
| *H05K 9/00* | (2006.01) | |
| *H01Q 17/00* | (2006.01) | |
| *H01Q 1/52* | (2006.01) | |
| *H01F 10/14* | (2006.01) | |
| *H01F 10/16* | (2006.01) | |

(52) U.S. Cl.
CPC ............ *H05K 9/0081* (2013.01); *H05K 9/0088* (2013.01); *H01Q 17/00* (2013.01); *H01Q 1/526* (2013.01); *H01F 10/14* (2013.01); *H01F 10/16* (2013.01)
USPC .......................................... 174/386; 174/391

(58) Field of Classification Search
CPC .................................................... H05K 9/0075
USPC ........................... 174/386, 391; 361/816, 818
See application file for complete search history.

(56) References Cited

U.S. PATENT DOCUMENTS

| | | | | |
|---|---|---|---|---|
| 4,749,625 | A * | 6/1988 | Obayashi et al. .............. | 428/624 |
| 6,048,601 | A * | 4/2000 | Yahagi et al. .................. | 428/147 |
| 6,262,364 | B1 * | 7/2001 | Yoshikawa et al. ........... | 174/389 |
| 6,713,671 | B1 * | 3/2004 | Wang et al. .................... | 174/391 |
| 2007/0052575 | A1 | 3/2007 | Nakagomi et al. | |
| 2010/0276193 | A1 * | 11/2010 | Liu ................. | 174/353 |
| 2011/0217531 | A1 * | 9/2011 | Kondo et al. .................. | 428/216 |
| 2012/0138357 | A1 * | 6/2012 | Lim et al. ....................... | 174/386 |
| 2012/0236528 | A1 * | 9/2012 | Le et al. ......................... | 361/818 |
| 2013/0240261 | A1 * | 9/2013 | Song et al. ..................... | 174/391 |

(Continued)

FOREIGN PATENT DOCUMENTS

| | | |
|---|---|---|
| JP | 2004-95566 A | 3/2004 |
| JP | 2006-93414 A | 4/2006 |

(Continued)

OTHER PUBLICATIONS

International Search Report issued in PCT/JP2011/076196, dated Feb. 14, 2012.

*Primary Examiner* — Hung V Ngo
(74) *Attorney, Agent, or Firm* — Birch, Stewart, Kolasch & Birch, LLP

(57) ABSTRACT

A near-field noise suppression sheet comprising a pair of plastic films each having a thin metal film on one surface, the plastic films being adhered by a conductive adhesive with the thin metal films inside, each thin metal film being made of a magnetic metal, and having a controlled thickness such that a pair of the adhered thin metal films have surface resistance of 20-150 Ω/square.

6 Claims, 31 Drawing Sheets

(56) References Cited

U.S. PATENT DOCUMENTS

| | | | |
|---|---|---|---|
| 2013/0306364 A1* | 11/2013 | Suzuki et al. | 174/394 |
| 2014/0177197 A1* | 6/2014 | Lampinen | 361/818 |

FOREIGN PATENT DOCUMENTS

| | | |
|---|---|---|
| JP | 2006-278433 A | 10/2006 |
| JP | 2006-279912 A | 10/2006 |
| JP | 2007-96269 A | 4/2007 |
| JP | WO 2007/105555 A1 | 9/2007 |
| JP | 2008-53383 A | 3/2008 |
| JP | 2008-218790 A | 9/2008 |
| JP | 2008-270714 A | 11/2008 |
| JP | 2010-153542 A | 7/2010 |
| JP | 2010-278090 A | 12/2010 |
| WO | WO 03/081973 A1 | 10/2003 |

* cited by examiner

NEAR-FIELD NOISE SUPPRESSION SHEET

FIELD OF THE INVENTION

The present invention relates to a near-field noise suppression sheet suitably useful for mobile information terminals such as mobile phones and smartphones, electronic appliances such as personal computers, etc.

BACKGROUND OF THE INVENTION

Recently, mobile communications terminals, electronic appliances, etc. having various functions and high performance have been getting required to be smaller and lighter, so that electronic parts are disposed in a narrower space at higher density, with their speeds increasing. Accordingly, among circuits and parts, electromagnetic wave noises, particularly high-frequency noises have become serious problems. To suppress such near-field electromagnetic wave noises, various noise suppression sheets have been proposed and put into practical use.

Many of such noise suppression sheets contain magnetic materials and/or conductive materials. For example, JP 2010-153542 A discloses an electromagnetic wave noise suppression sheet comprising a substrate, a conductive layer formed by an electrically conductive coating material containing particles, flakes or thin wires of metals such as Cu, or carbon, and a magnetic layer formed by a magnetic coating material containing soft-magnetic materials such as ferrite, Sendust, Permalloy, etc. JP 2006-278433 A discloses a composite sheet for suppressing electromagnetic wave noises, which is obtained by laminating two or more calendered sheets each comprising soft-magnetic powder such as amorphous flakes having a composition of $Fe_{bal}$—$Cu_1$—$Si_{12.5}$—$Nb_3$—$Cr_1$—$B_{12}$ (atomic %), for example, and a resin, and further calendering the resultant laminate for integration. However, any of the noise suppression sheets disclosed in JP 2010-153542 A and JP 2006-278433 A does not have sufficient capability of absorbing near-field noises, is difficult to be made thinner because it contains magnetic materials and/or conductive materials blended in the resin, and suffers a high production cost.

JP 2006-279912 A discloses a sputtered thin film of AlO, CoAlO, CoSiO, etc., as a thin film for suppressing near-field electromagnetic wave noises generated in a quasi-microwave band, which has surface resistance controlled to 10-1000 $\Omega$/square matching to the characteristic impedance Z (377$\Omega$) of free space, to have a reflection coefficient ($S_{11}$) of $-10$ dB or less and a noise suppression effect ($\Delta P_{loss}/P_{in}$) of 0.5 or more. However, this thin film for suppressing near-field electromagnetic wave noises does not have sufficient electromagnetic wave absorbability.

JP 2008-53383 A discloses a radiowave-absorbing and shielding film having excellent heat dissipation characteristics, which comprises a graphite film having different thermal conductivities in plane and thickness directions, and a soft-magnetic layer formed on the graphite film, which contains soft-magnetic materials such as Fe, Co, FeSi, FeNi, FeCo, FeSiAl, FeCrSi, FeBSiC, etc., ferrite such as Mn—Zn ferrite, Ba—Fe ferrite, Ni—Zn ferrite, etc., or carbon particles. However, this radiowave-absorbing and shielding film does not have sufficient electromagnetic wave absorbability.

JP 2006-93414 A discloses a conduction noise suppression body comprising a conduction noise suppression layer of 0.005-0.3 μm in thickness formed by a physical vapor deposition method on a substrate made of plastics such as polyesters, etc., which may contain powder of a soft-magnetic metal, carbon, ferrite, etc., the conduction noise suppression layer being made of at least one soft-magnetic metal selected from the group consisting of iron, cobalt and nickel, and the conduction noise suppression layer comprising portions having a crystal lattice in which soft-magnetic metal atoms are arranged with intervals of several angstroms, extremely small portions composed of plastics without the soft-magnetic metal, and portions in which the soft-magnetic metal is dispersed without crystallization in the plastics. However, because the conduction noise suppression layer in this conduction noise suppression body is a single layer, its thickness is difficult to control. Accordingly, in most Examples, the soft-magnetic metal is blended in the plastic substrate. In Example 4, which is an only example using a plastic substrate containing no soft-magnetic metal, the power loss ratio ($P_{loss}/P_{in}$) at 1 GHz is as small as 0.55.

OBJECT OF THE INVENTION

Accordingly, an object of the present invention is to provide a low-cost, near-field noise suppression sheet stably having high capability of absorbing electromagnetic wave noises of several hundreds of MHz to several GHz.

DISCLOSURE OF THE INVENTION

As a result of intensive research in view of the above object, the inventor has found that (a) although excellent absorption of near-field noises is achieved by controlling the thickness of a thin metal film formed on a plastic film to have surface resistance of 20-150 $\Omega$/square, large unevenness of surface resistance is inevitable among the same or different lots of products, because the thin metal film having surface resistance of 20-150 $\Omega$/square is extremely thin, and that (b) the adhesion of a pair of plastic films having such thin metal films by a conductive adhesive with the thin metal films inside extremely reduces the unevenness of surface resistance, stably providing a thin metal film sheet with the desired surface resistance. The present invention has been completed based on such findings.

Thus, the near-field noise suppression sheet of the present invention comprises a pair of plastic films each having a thin metal film on one surface, the plastic films being adhered by a conductive adhesive with the thin metal films inside, each thin metal film being made of a magnetic metal, and having a controlled thickness such that a pair of the adhered thin metal films have surface resistance of 20-150 $\Omega$/square.

The magnetic metal is preferably Ni, Fe, Co or an alloy thereof, particularly Ni. Both thin metal films preferably have thicknesses in a range of 10-30 nm. A pair of the adhered thin metal films preferably have surface resistance of 30-80 $\Omega$/square. The thin metal film is formed preferably by a vacuum vapor deposition method.

DESCRIPTION OF THE PREFERRED EMBODIMENTS

The embodiments of the present invention will be explained referring to the attached drawings, and it should be noted that explanation concerning one embodiment is applicable to other embodiments unless otherwise mentioned. Also, the following explanation is not restrictive, and various modifications may be made within the scope of the present invention.

[1] Elements of Near-Field Noise Suppression Sheet

Figure 1:
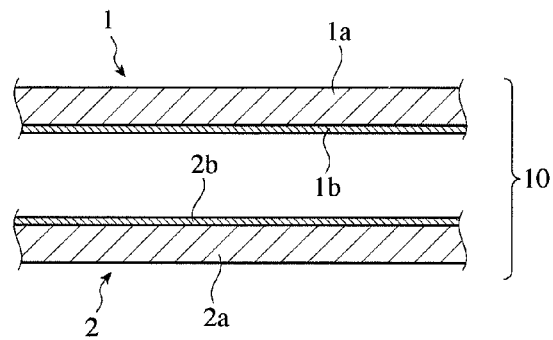
FIG. 1 is a cross-sectional view showing a pair of sheets constituting the near-field noise suppression sheet of the present invention.
Figure 2:
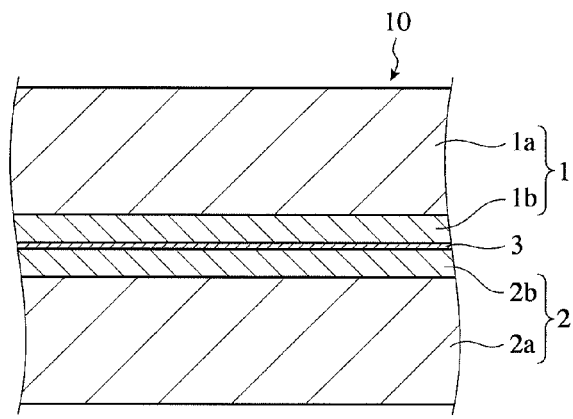
FIG. 2 is an enlarged cross-sectional view showing the structure of the near-field noise suppression sheet of the present invention.

As shown in FIGS. 1 and 2, the near-field noise suppression sheet 10 of the present invention comprises a first sheet 1, which is constituted by a plastic film 1a having a thin metal film 1b formed on one surface, and a second sheet 2, which is constituted by a plastic film 2a having a thin metal film 2b formed on one surface, the first sheet 1 and the second sheet 2 being adhered by a conductive adhesive 3.

(1) Plastic Film

Resins forming each plastic film 1a, 2a are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyether sulfone, polyetheretherketone, polycarbonates, acrylic resins, polystyrenes, polyolefins (polyethylene, polypropylene, etc.), etc. The thickness of the plastic film may be about 10-30 μm.

(2) Thin Metal Film

Each thin metal film 1b, 2b is made of a magnetic metal. The magnetic metal may be Ni, Fe, Co or an alloy thereof. Though the thin metal film 1b may be a single magnetic metal layer or a multilayer of different magnetic metals, it is preferably a single layer of Ni from the aspect of corrosion resistance. The thin metal film may be formed by known methods such as a sputtering method, a vacuum vapor deposition method, etc., and the vacuum vapor deposition method is preferable.

Figure 3:
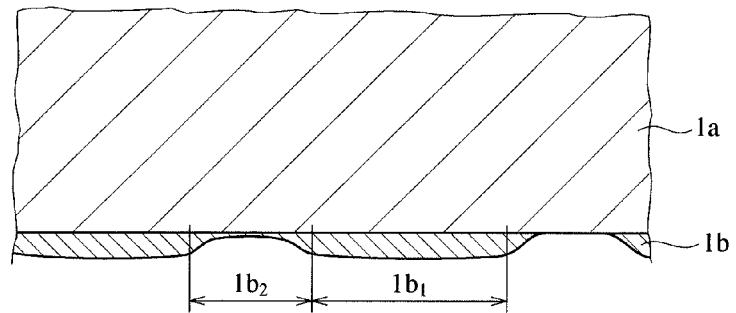
FIG. 3 is an enlarged cross-sectional view showing the structure of a thin metal film on a sheet constituting the near-field noise suppression sheet of the present invention.

It has been found that as the thin films 1b, 2b made of a magnetic metal become thinner such that they have surface resistance of 20-150 Ω/square after laminated via a conductive adhesive 3, their capability of absorbing high-frequency, near-field noises, specifically, near-field noises of 6 GHz or less, particularly 1-3 GHz, becomes extremely higher. For example, as is clear from FIG. 3 schematically and enlargedly showing a cross section of the thin metal film 1b, the thin metal film 1b is so extremely thin that it has unevenness in thickness over an entire surface, having relatively thick regions $1b_1$ and relatively thin regions (including portions having no thin metal film formed) $1b_2$. It may be considered that the relatively thin regions $1b_2$ function as magnetic gaps and high resistance regions, attenuating magnetic fluxes and current induced in the thin metal film 1b by near-field noises.

Figure 4:
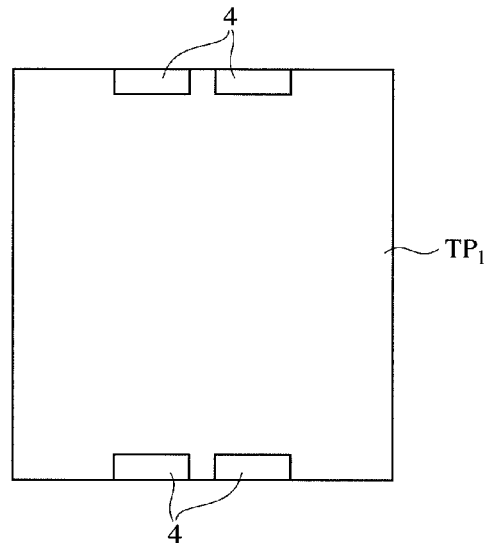
FIG. 4 is a plan view showing a method for measuring the surface resistance of a thin metal film formed on a plastic film.
Figure 5A:
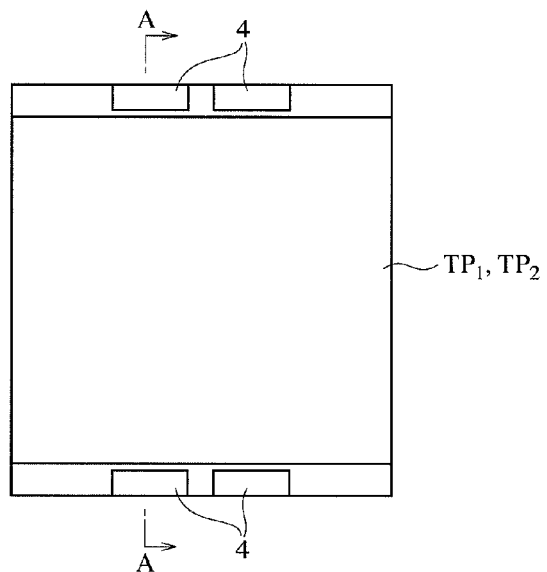
FIG. 5(a) is a plan view showing a method for measuring the surface resistance of a thin metal film in the near-field noise suppression sheet of the present invention.
Figure 5B:
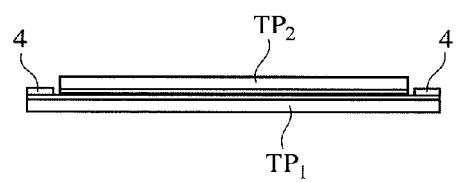
FIG. 5(b) is a cross-sectional view taken along the line A-A in FIG. 5(a).

Accordingly, the thickness of each thin metal film 1b, 2b is controlled to have surface resistance of 20-150 Ω/square after laminated by a conductive adhesive 3. Specifically, the thickness of the thin metal film 1b, 2b is preferably 10-30 nm, more preferably 15-30 nm, most preferably 20-30 nm. The surface resistance of each thin metal film 1b, 2b is measured by a DC four-terminal method as shown in FIG. 4. Also, the surface resistance of the laminated thin metal films 1b, 2b is measured by a DC four-terminal method, with one test piece $TP_1$ set larger than the other test piece $TP_2$, and terminals 4 attached to one test piece $TP_1$ as shown in FIGS. 5(a) and 5(b).

Figure 6:
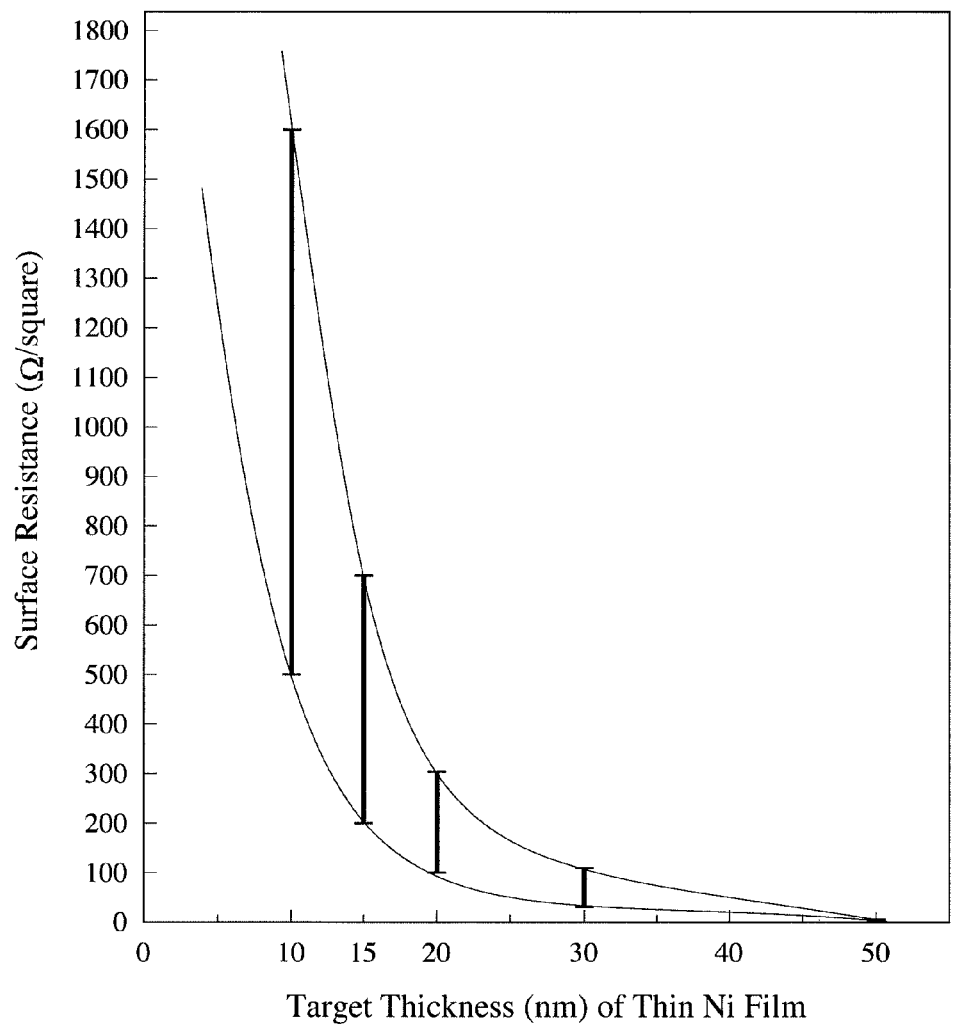
FIG. 6 is a graph showing the relation between the surface resistance and target thickness of a thin Ni film vapor-deposited on a plastic film.

It has been found, however, that as the thin metal films 1b, 2b become thinner, their surface resistance tends to increase with extremely increased unevenness. The unevenness of surface resistance exists not only among product lots, but also in the same vapor-deposited film product. Such unevenness occurs, presumably because it is difficult to precisely control the production conditions of extremely thin metal films. In the case of a thin Ni film, for example, its surface resistance changes with a target thickness as shown in Table 1 and FIG. 6. The target thickness is determined from the difference between the light transmittance of a plastic film provided with a thin metal film and the light transmittance of a plastic film per se.

TABLE 1

| Target Thickness (nm) | Surface Resistance (Ω/square) |
|---|---|
| 10 | 500-1600 |
| 15 | 200-700 |
| 20 | 100-300 |
| 30 | 30-110 |
| 50 | 4-6 |

(3) Conductive Adhesive

The conductive adhesive 3 for adhering a pair of thin metal films 1b, 2b comprises conductive fillers such as silver powder, gold powder, copper powder, palladium powder, nickel powder, carbon powder, etc. in a binder such as epoxy resins, silicone resins, polyimides, polyurethanes, etc. The volume resistivity of typical conductive adhesives, and the contact resistance of Ni with conductive adhesives are shown in Tables 2 and 3 below.

TABLE 2

| Type | Volume Resistivity (Ω · cm) |
|---|---|
| Silver-Based Adhesive | $1.1 \times 10^{-4}$ |
| Nickel-Based Adhesive | $2.7 \times 10^{-1}$ |
| Gold-Based Adhesive | $2.1 \times 10^{-2}$ |
| Palladium-Based Adhesive | $8.2 \times 10^{-2}$ |
| Carbon-Based Adhesive | $1.3 \times 10^{-1}$ |

TABLE 3

| Type | Contact Resistance With Ni (mΩ) |
|---|---|
| Silver-Based Adhesive | 700 |
| Nickel-Based Adhesive | 140 |
| Gold-Based Adhesive | 61 |
| Palladium-Based Adhesive | 27 |
| Carbon-Based Adhesive | 12000 |

[2] Near-Field Noise Suppression Sheet

Because a thin metal film having an extremely small target thickness has large unevenness in surface resistance, it is extremely difficult to produce a near-field noise suppression sheet having the desired surface resistance with one plastic film provided with a thin metal film. The unevenness of surface resistance results in the unevenness of the capability of absorbing near-field noises. Intensive research has revealed that the adhesion of a pair of thin metal films 1b, 2b via a conductive adhesive 3 unexpectedly reduces the unevenness of surface resistance. The near-field noise suppression sheet of the present invention has been obtained based on such finding.

For example, the adhesion of a pair of thin Ni films having various thicknesses by a silver paste ("DOTITE" available from Fujikurakasei Co., Ltd.) as a conductive adhesive in an amount of 1.5 g/m² on a solid basis provides surface resistance shown in Table 4. As is clear from Table 4, the adhesion of two thin Ni films via a conductive adhesive 3 reduces the surface resistance with extremely decreased unevenness, thereby stably providing a near-field noise suppression sheet with the desired absorbability.

TABLE 4

| Target Thicknesses (nm) of Thin Ni Films Adhered | Surface Resistance (Ω/square) |
|---|---|
| 15/20 | 65-110 |
| 20/20 | 55-90 |
| 10/30 | 40-55 |
| 15/30 | 35-50 |
| 20/30 | 30-40 |
| 30/30 | 24 |

When the adhered thin metal films have surface resistance of less than 20 Ω/square, they have too high electric conductivity, behaving like a metal sheet and thus having low noise absorbability. On the other hand, when the adhered thin metal films have surface resistance of more than 150 Ω/square, they have too large surface resistance, resulting in insufficient noise absorbability. The surface resistance of the adhered thin metal films is preferably 24-80 Ω/square, more preferably 30-80 Ω/square, most preferably 35-60 Ω/square.

The amount of the conductive adhesive 3 coated is preferably as small as possible unless both sheets are peeled during handling. Specifically, the amount (on a solid basis) of the conductive adhesive coated is preferably 0.5-5 g/m², more preferably 1-2 g/m².

[3] Measurement of Near-field Noise Absorbability (1) Measurement of Transmission Attenuation Ratio Using a system comprising a microstripline MSL (64.4 mm×4.4 mm) of 50 Ω, an insulation substrate 200 supporting the microstripline MSL, a grounded electrode 201 attached to a lower surface of the insulation substrate 200, conductor pins 202, 202 connected to both edges of the microstripline MSL, a network analyzer NA, and coaxial cables 203, 203 for connecting the network analyzer NA to the conductor pins

Figure 7A:
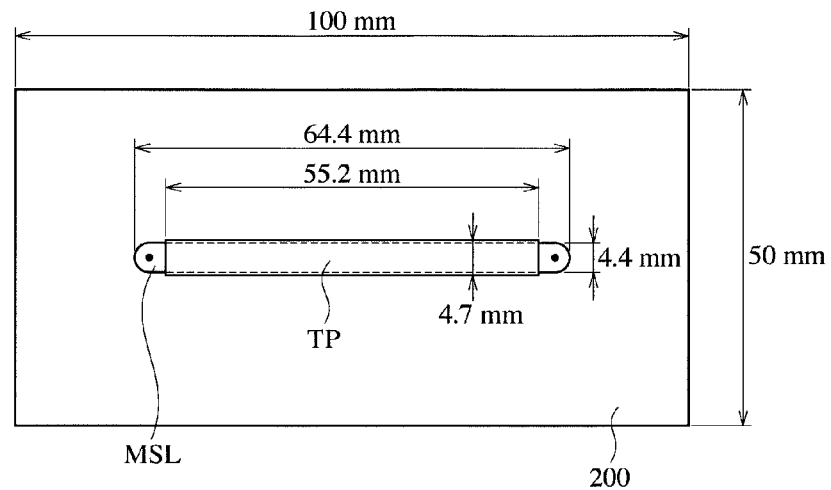
FIG. 7(a) is a plan view showing a system for measuring reflected wave power and transmitted wave power to an incident wave.
Figure 7B:
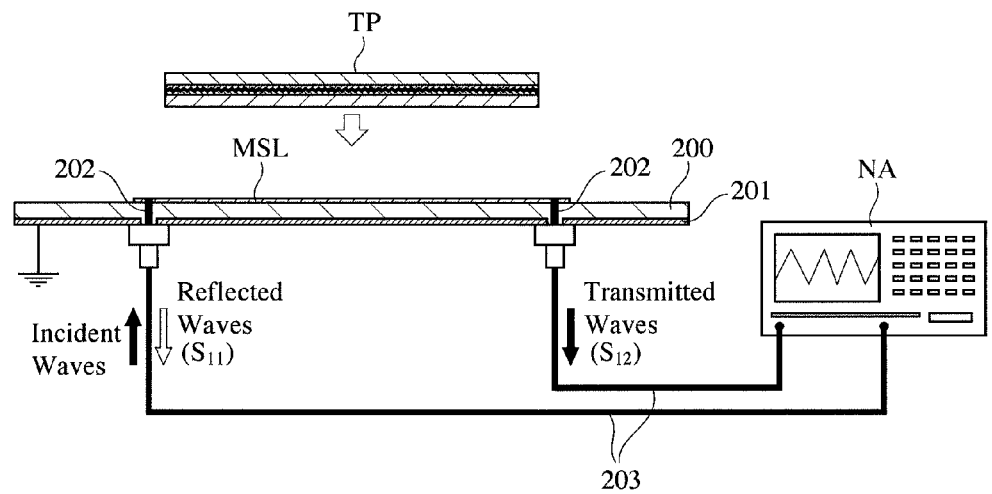
FIG. 7(b) is a partially cross-sectional, schematic view showing the system of FIG. 7(a).

202, 202 as shown in FIGS. 7(*a*) and 7(*b*), with a test piece TP of the noise suppression sheet attached to the micro stripline MSL by an adhesive, the power of reflected waves $S_{11}$ and the power of transmitted waves $S_{21}$ are measured with incident waves of 0.1-6 GHz, to determine the transmission attenuation ratio Rtp by the following formula:

$$Rtp = -10 \times \log [10^{S21/10}/(1-10^{S11/10})].$$

(2) Measurement of Noise Absorption Ratio

The power loss $P_{loss}$ is determined by subtracting the power of reflected waves $S_{11}$ and the power of transmitted waves $S_{21}$ from the power input to the system shown in FIGS. 7(*a*) and 7(*b*), and the noise absorption ratio $P_{loss}/P_{in}$ is determined by dividing $P_{loss}$ by the input power $P_{in}$.

(3) Measurement of Intra-Decoupling Ratio

Figure 8:
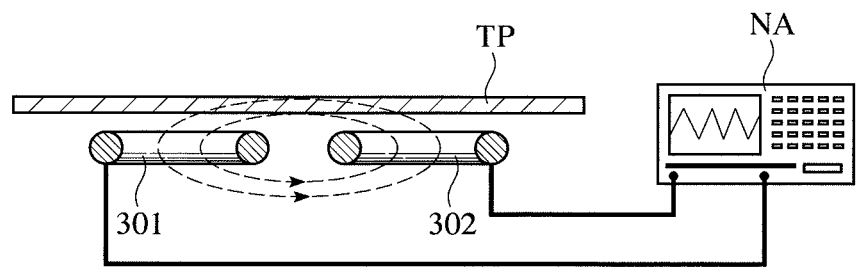
FIG. 8 is a partially cross-sectional, schematic view showing a method for measuring the intra-decoupling ratio of a near-field noise suppression sheet.

The intra-decoupling ratio Rda indicates the degree of reduction of coupling in the same printed circuit board by a noise suppression sheet. With a test piece TP of a noise suppression sheet placed near a pair of loop antennas 301, 302 connected to a network analyzer NA as shown in FIG. 8, high-frequency signals of 0-6 GHz are transmitted from one loop antenna 301 to the other loop antenna 302 to measure their attenuation ratio, thereby determining the intra-decoupling ratio Rda.

(4) Inter-Decoupling Ratio

Figure 9:
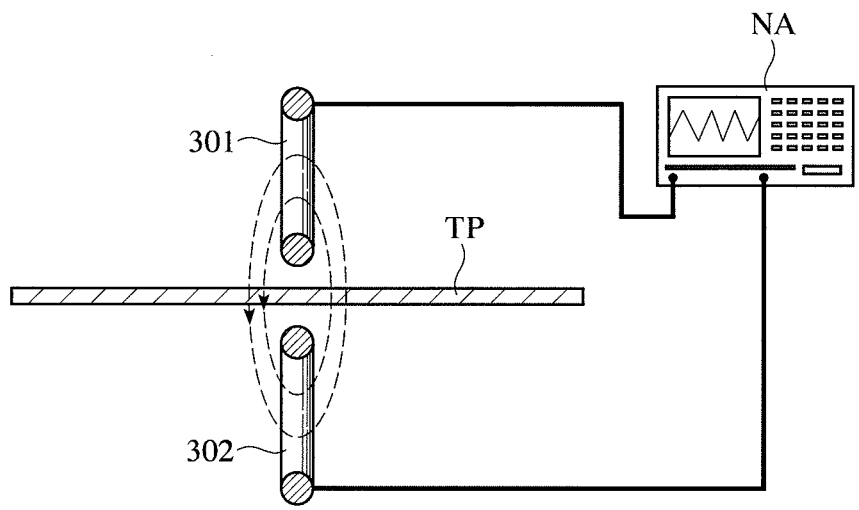
FIG. 9 is a partially cross-sectional, schematic view showing a method for measuring the inter-decoupling ratio of a near-field noise suppression sheet.

The inter-decoupling ratio Rde indicates the degree of reduction of coupling between two printed circuit boards or parts by a noise suppression sheet. With a test piece TP of a noise suppression sheet placed between a pair of the loop antennas 301, 302 connected to the network analyzer NA as shown in FIG. 9, high-frequency signals of 0-6 GHz are transmitted from one loop antenna 301 to the other loop antenna 302 to measure their attenuation ratio, thereby determining the inter-decoupling ratio Rde.

The present invention will be explained in more detail referring to Examples below without intention of restricting the present invention thereto.

Examples 1-3

A thin Ni film 1*b* having the thickness shown in Table 5 below was formed on a 16-μm-thick PET film 1*a* by a vacuum vapor deposition method, to obtain a first sheet 1. Likewise, a thin Ni film 2*b* having the thickness shown in Table 5 below was formed on a 16-μm-thick PET film 2*a*, to obtain a second sheet 2. The first and second sheets 1, 2 were adhered with the thin Ni films 1*b*, 2*b* inside, by 1.5 g/m² (on a solid basis) of a silver paste ("DOTITE" available from Fujikurakasei Co., Ltd.) as a conductive adhesive. Test pieces TP were cut out of arbitrary five portions of the resultant laminate sheet, a near-field noise suppression sheet. The surface resistance of each test piece TP was measured by the method shown in FIGS. 5(*a*) and 5(*b*). The range and average of surface resistance of each thin Ni film are shown in Table 5 together with its thickness. As is clear from Table 5, each Example had small unevenness in surface resistance.

TABLE 5

| No. | Thickness of Thin Ni Film (nm) | | Surface Resistance (Ω/square) | |
|---|---|---|---|---|
| | First Sheet | Second Sheet | Range | Average |
| Example 1 | 15 | 30 | 37-45 | 40 |
| Example 2 | 20 | 20 | 58-73 | 66 |
| Example 3 | 15 | 20 | 70-102 | 80 |

Figure 10:
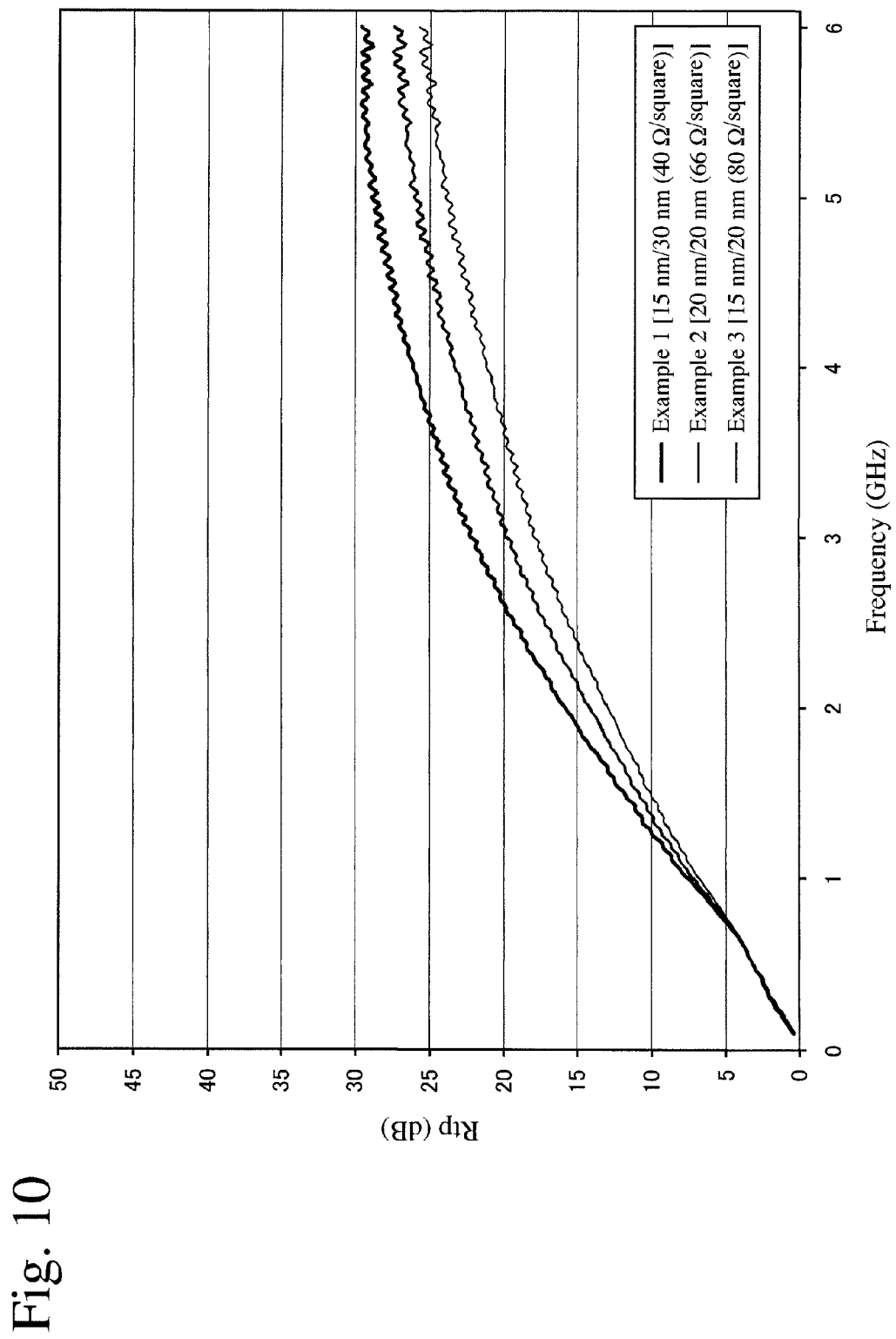
FIG. 10 is a graph showing the transmission attenuation ratios Ptp of the near-field noise suppression sheets of Examples 1-3.
Figure 11:
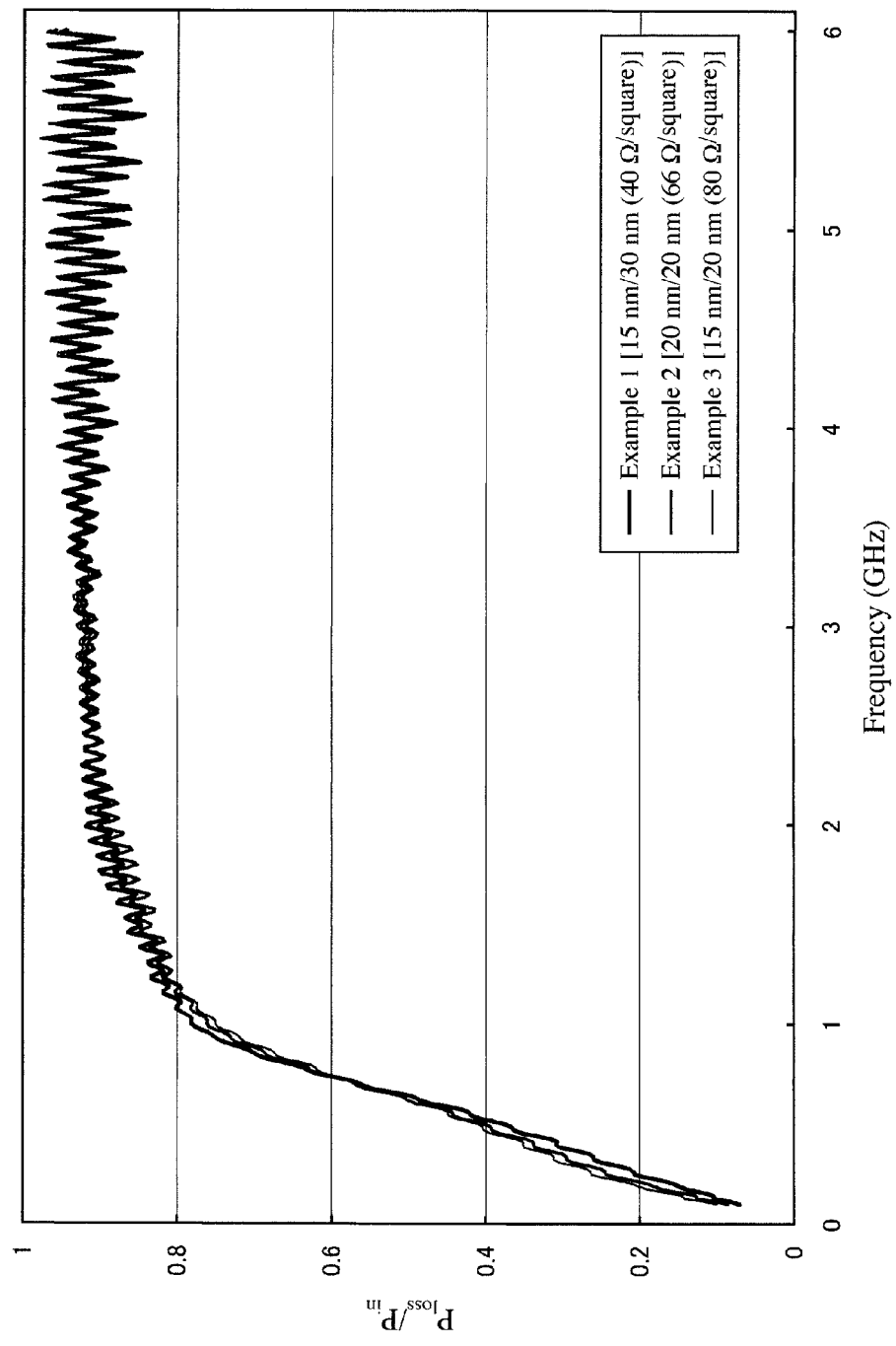
FIG. 11 is a graph showing the noise absorption ratios $P_{loss}/P_{in}$, of the near-field noise suppression sheets of Examples 1-3.
Figure 12:
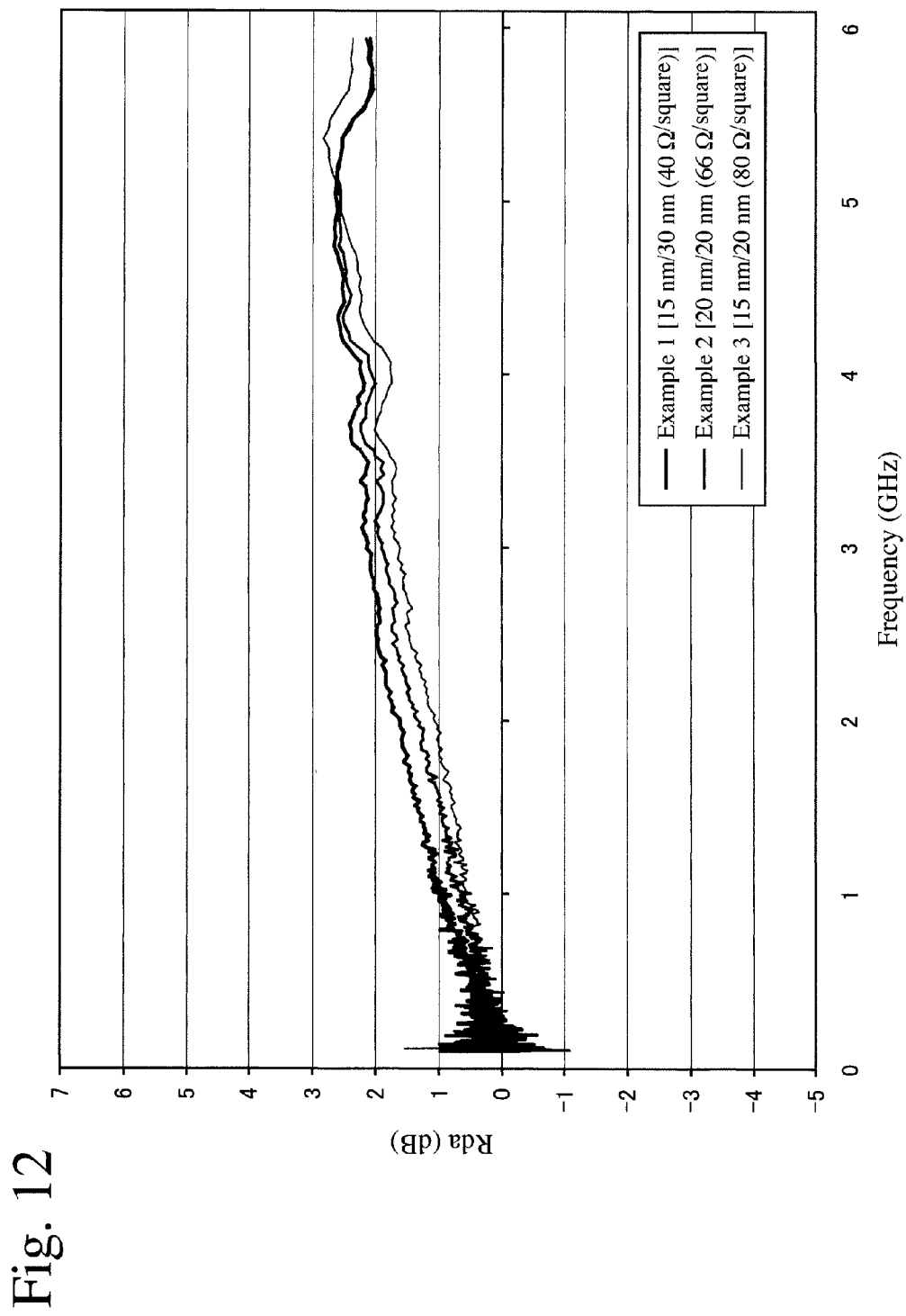
FIG. 12 is a graph showing the intra-decoupling ratios Rda of the near-field noise suppression sheets of Examples 1-3.
Figure 13:
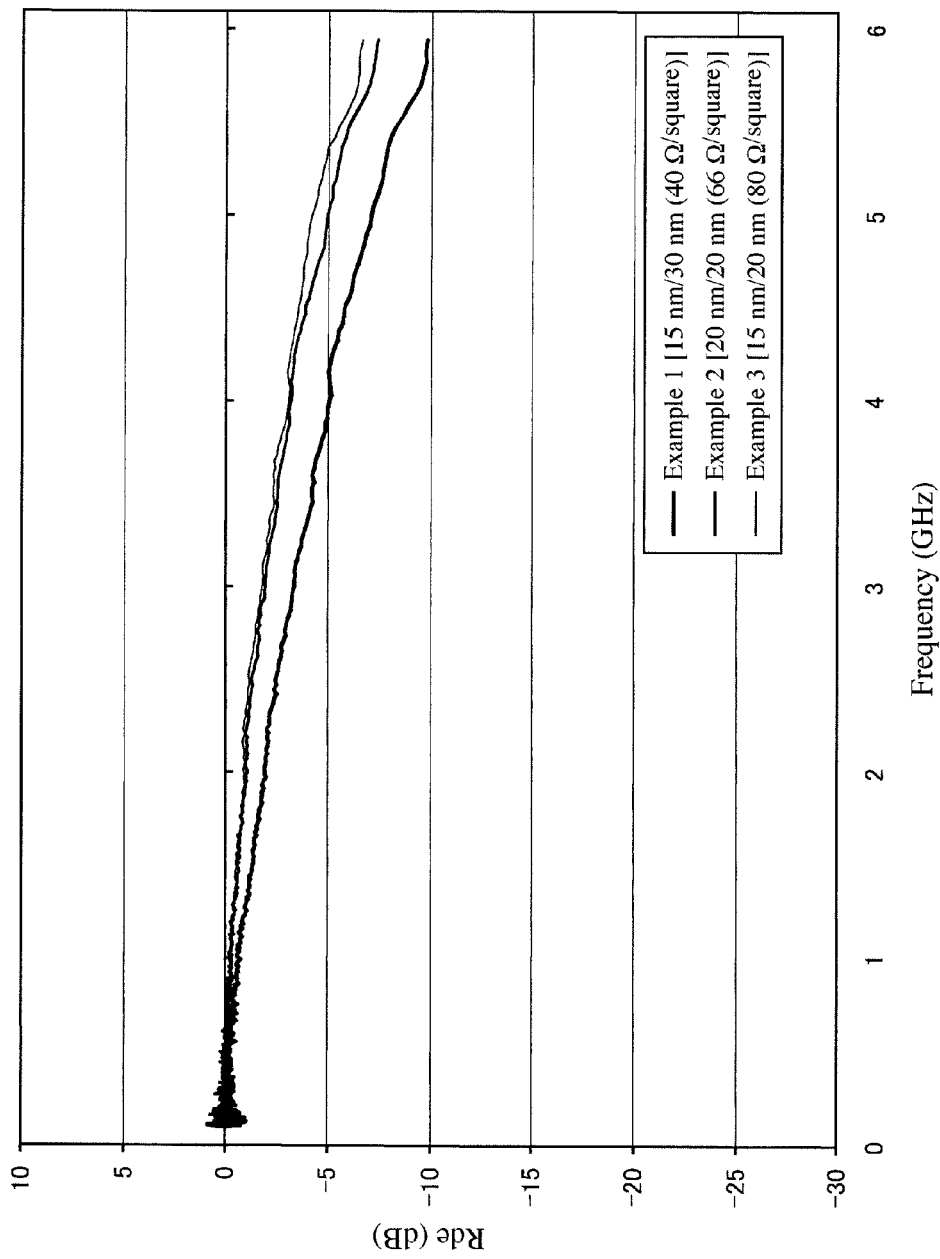
FIG. 13 is a graph showing the inter-decoupling ratios Rde of the near-field noise suppression sheets of Examples 1-3.

A test piece TP having the closest surface resistance to the average value was attached to a microstripline MSL in the system shown in FIGS. 7(*a*) and 7(*b*) by an adhesive, to measure the power of reflected waves $S_{11}$ and the power of transmitted waves $S_{21}$, from which a transmission attenuation ratio Rtp and a noise absorption ratio $P_{loss}/P_{in}$ were determined by the method described in [3] (1) and (2) above. Further, the intra-decoupling ratio Rda of each test piece TP was measured by the method shown in FIG. 8, and the inter-decoupling ratio Rde of each test piece TP was measured by the method shown in FIG. 9. The transmission attenuation ratios Rtp are shown in FIG. 10, the noise absorption ratios $P_{loss}/P_{in}$ are shown in FIG. 11, the intra-decoupling ratios Rda are shown in FIG. 12, and the inter-decoupling ratios Rde are shown in FIG. 13. In each figure, numbers in the brackets indicate (the thickness of a thin Ni film in one sheet)/(the thickness of a thin Ni film in another sheet), and numbers in the parentheses indicate surface resistance. The same is true below.

As is clear from FIG. 10, any near-field noise suppression sheets of Examples 1-3 had good transmission attenuation ratios Rtp, and the near-field noise suppression sheet of Example 1 having surface resistance of 40 Ω/square exhibited the best transmission attenuation ratio Rtp. As is clear from FIG. 11, any near-field noise suppression sheets of Examples 1-3 had good noise absorption ratios $P_{loss}/P_{in}$, particularly 0.8 or more at frequencies over about 1 GHz. Also, as is clear from FIGS. 12 and 13, any near-field noise suppression sheets of Examples 1-3 exhibited good intra-decoupling ratios Rda and inter-decoupling ratios Rde. This indicates that any near-field noise suppression sheets of Examples 1-3 had excellent noise reduction capability in a wide frequency range including a low-frequency range of 1-3 GHz.

Comparative Examples 1 and 2

Figure 14:
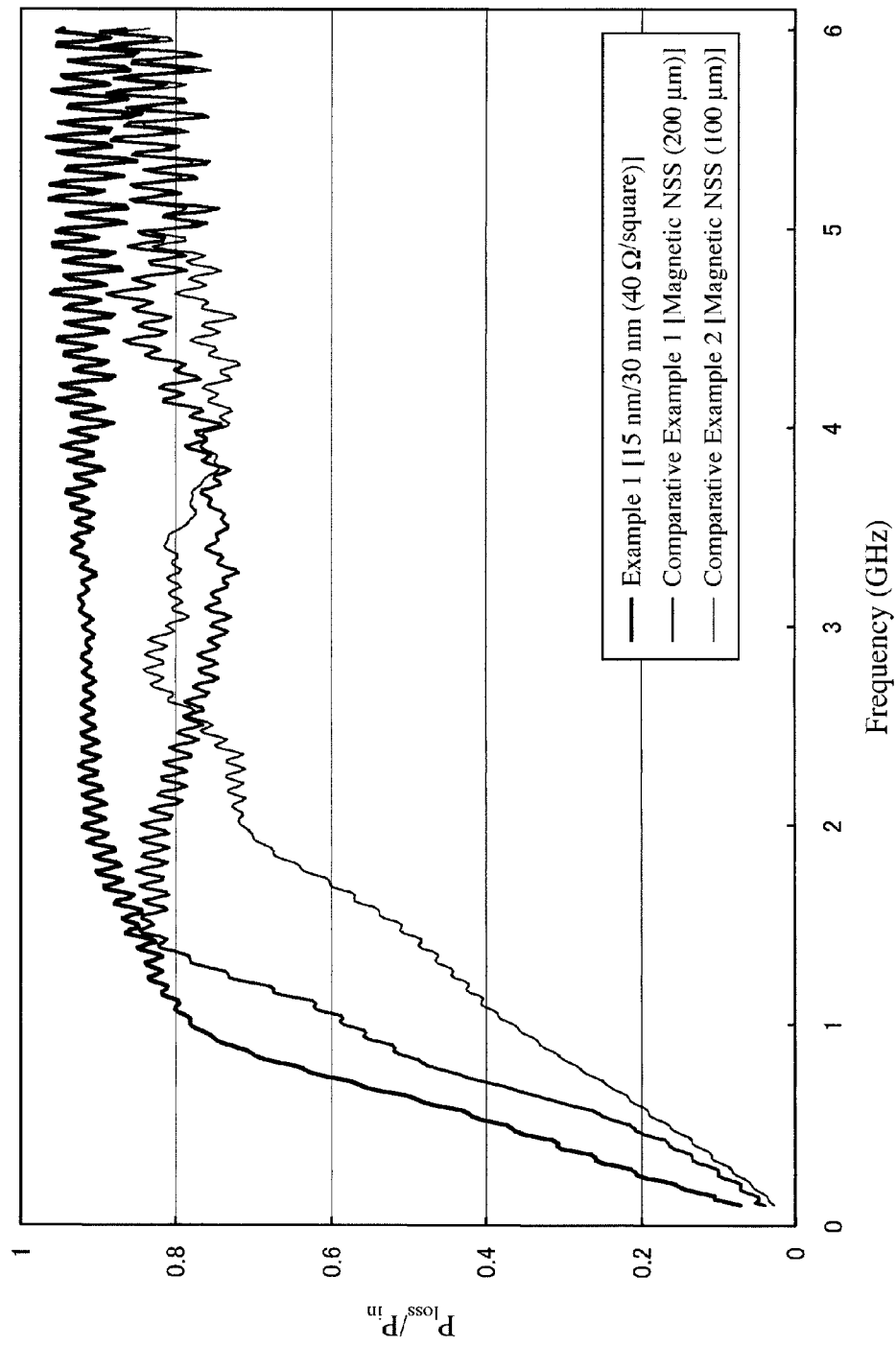
FIG. 14 is a graph showing the noise absorption ratios $P_{loss}/P_{in}$ of the near-field noise suppression sheets of Example 1 and Comparative Examples 1 and 2.
Figure 15:
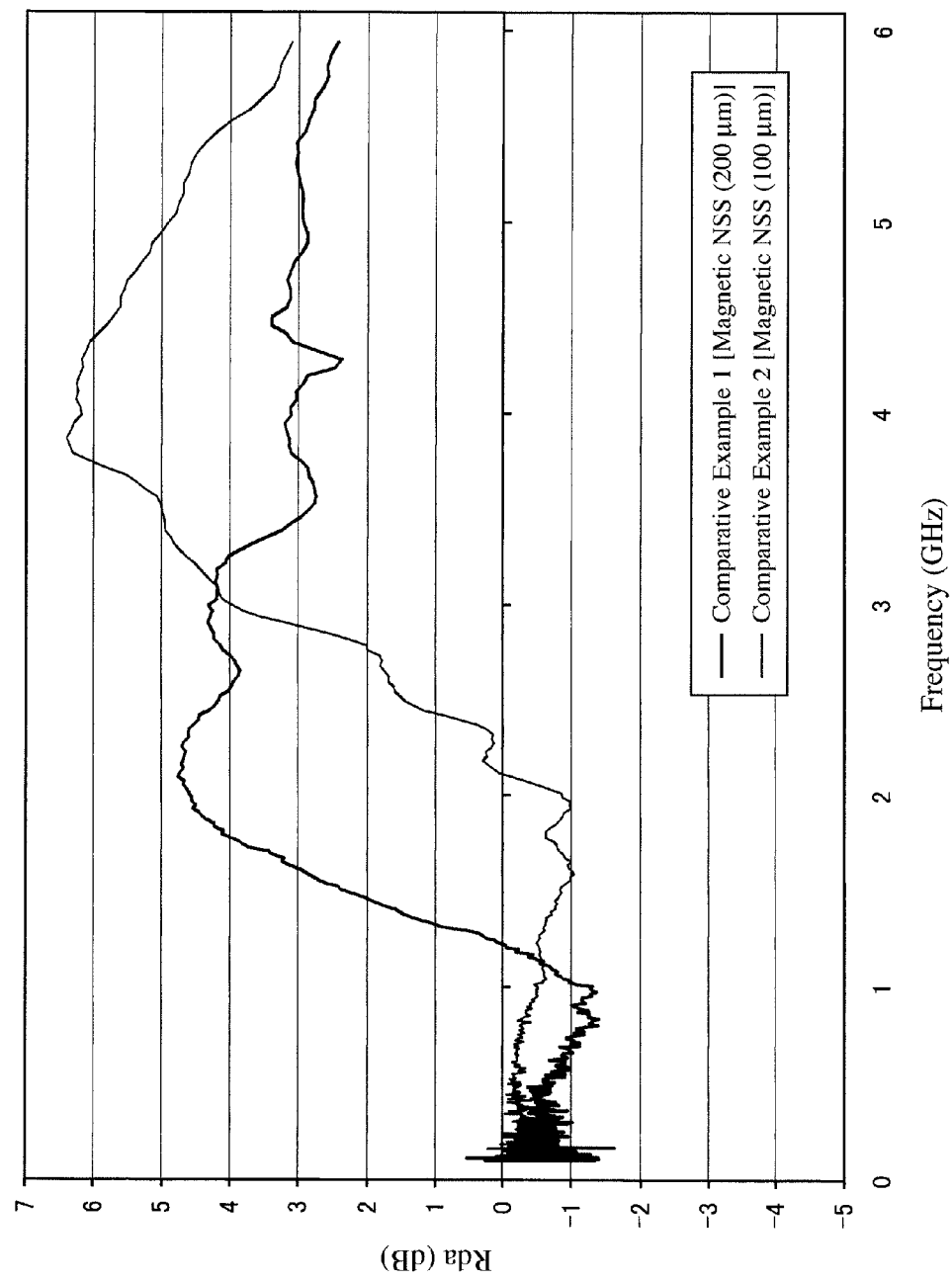
FIG. 15 is a graph showing the intra-decoupling ratios Rda of the near-field noise suppression sheets of Comparative Examples 1 and 2.
Figure 16:
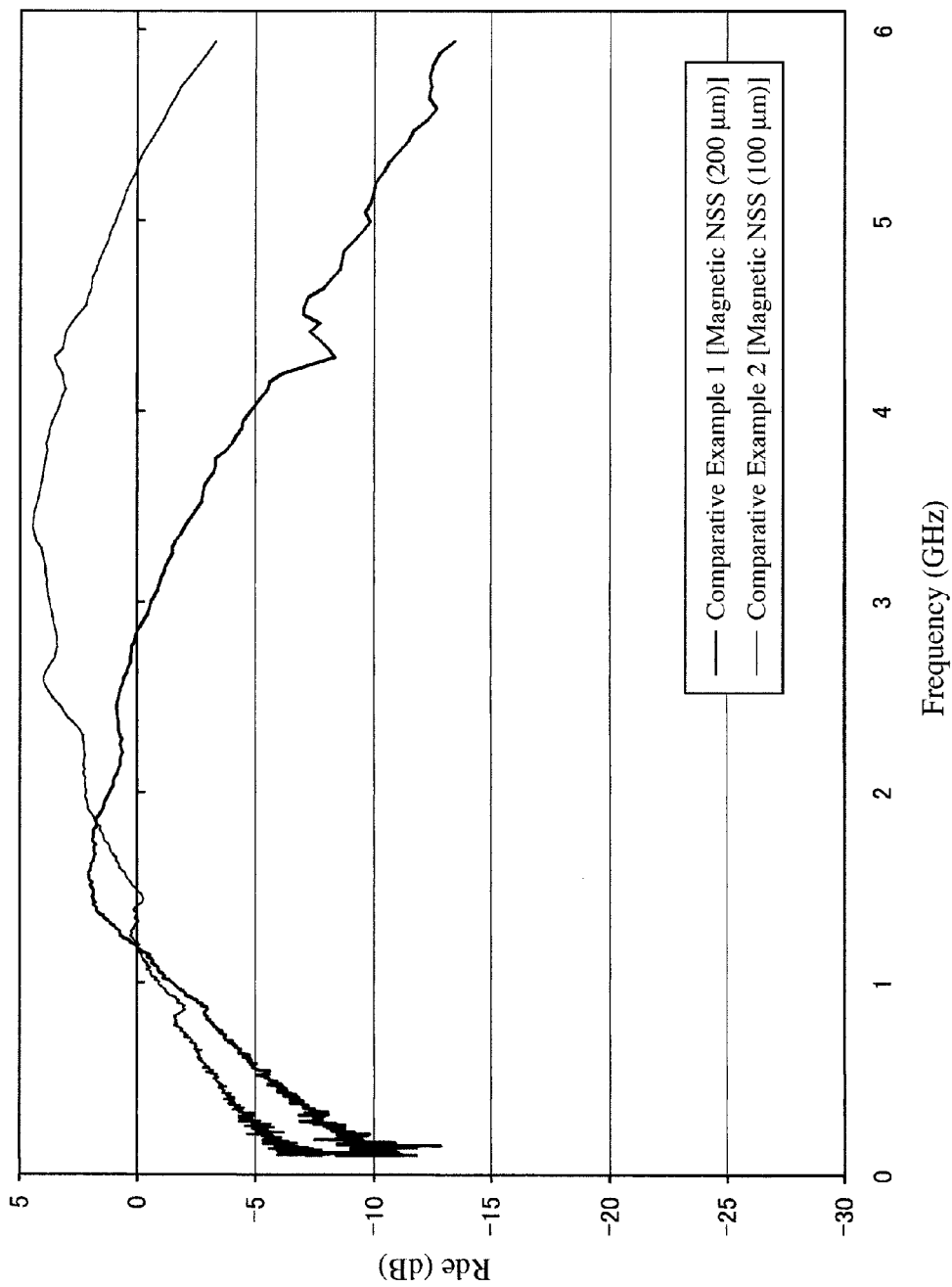
FIG. 16 is a graph showing the inter-decoupling ratios Rde of the near-field noise suppression sheets of Comparative Examples 1 and 2.

A commercially available, 200-μm-thick noise suppression sheet NSS ("HyperShield" available from Daido Steel Co., Ltd.) as Comparative Example 1, and a commercially available, 100-μm-thick noise suppression sheet NSS ("BUSTERAID" available from NEC TOKIN Corporation) as Comparative Example 2 were measured in the same manner as in Example 1, with respect to a noise absorption ratio $P_{loss}/P_{in}$, an intra-decoupling ratio Rda and an inter-decoupling ratio Rde. The noise absorption ratios $P_{loss}/P_{in}$ are shown in FIG. 14, the intra-decoupling ratios Rda are shown in FIG. 15, and the inter-decoupling ratios Rde are shown in FIG. 16. As is clear from FIG. 14, the noise suppression sheets of Comparative Examples 1 and 2 had poorer noise absorption ratios $P_{loss}/P_{in}$ than that of Example 1. Also, as is clear from FIGS. 15 and 16, the noise suppression sheets of Comparative Examples 1 and 2 had poor intra-decoupling ratios Rda and inter-decoupling ratios Rde.

Examples 4 and 5

A thin Ni film 1*b* having the thickness shown in Table 6 below was formed on a 16-μm-thick PET film 1*a* by a vacuum vapor deposition method, to obtain a first sheet 1. Likewise, a thin Ni film 2*b* having the thickness shown in Table 6 below was formed on a 16-μm-thick PET film 2*a*, to obtain a second sheet 2. The first and second sheets 1, 2 were adhered by the same conductive adhesive as in Example 1, with the thin Ni films 1b, 2b inside. Test pieces TP were cut out of arbitrary five portions of the resultant laminate sheet, a near-field noise suppression sheet. The surface resistance of each test piece TP was measured by the method shown in FIGS. 5(a) and 5(b). The range and average of the surface resistance of each thin Ni film are shown in Table 6, together with its thickness. As is clear from Table 6, each Example had small unevenness in surface resistance.

TABLE 6

| | Thickness of Thin Ni Film (nm) | | Surface Resistance (Ω/square) | |
|---|---|---|---|---|
| No. | First Sheet | Second Sheet | Range | Average |
| Example 4 | 10 | 20 | 72-122 | 100 |
| Example 5 | 10 | 15 | 105-195 | 150 |

Figure 17:
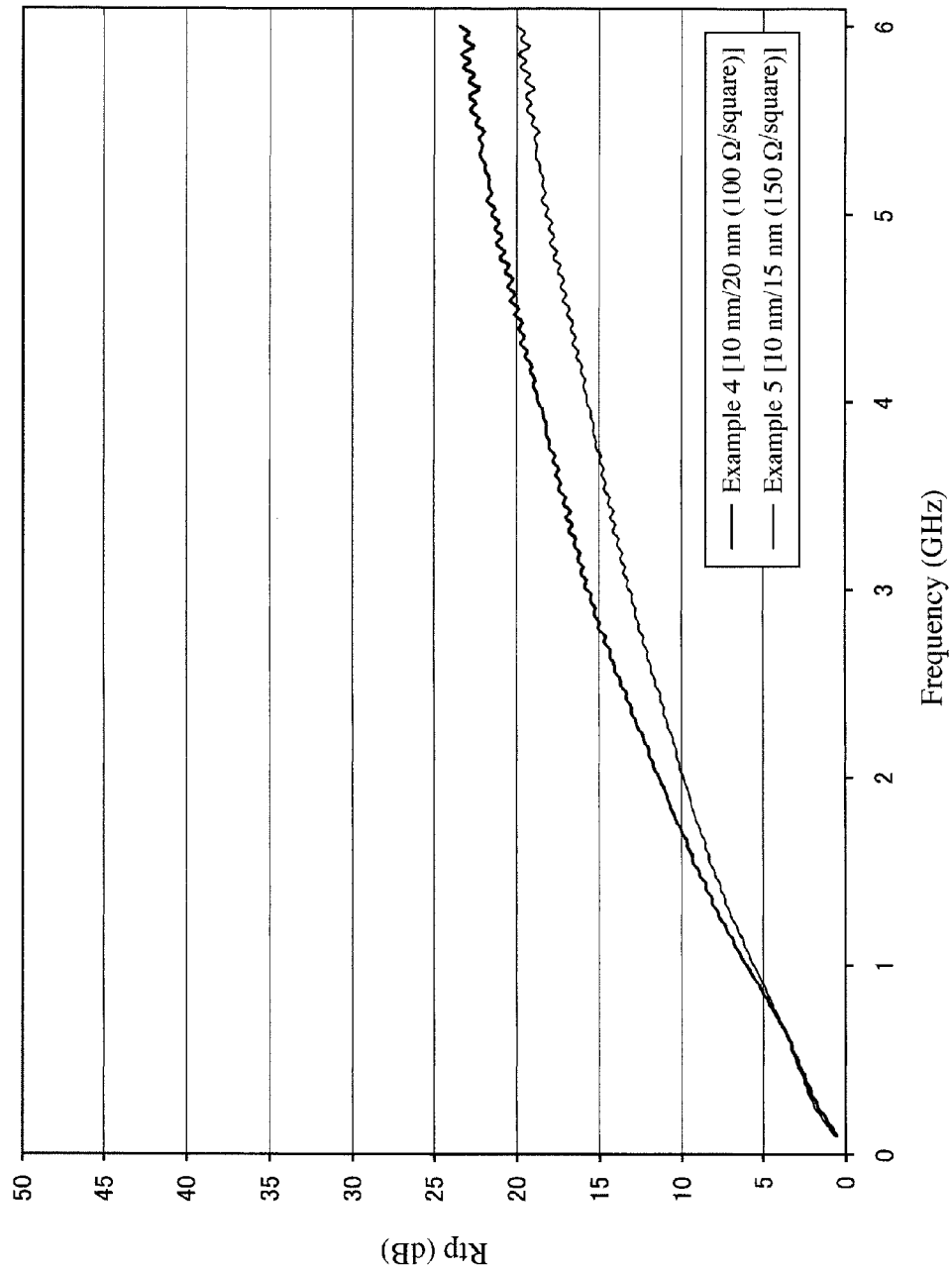
FIG. 17 is a graph showing the transmission attenuation ratios Ptp of the near-field noise suppression sheets of Examples 4 and 5.
Figure 18:
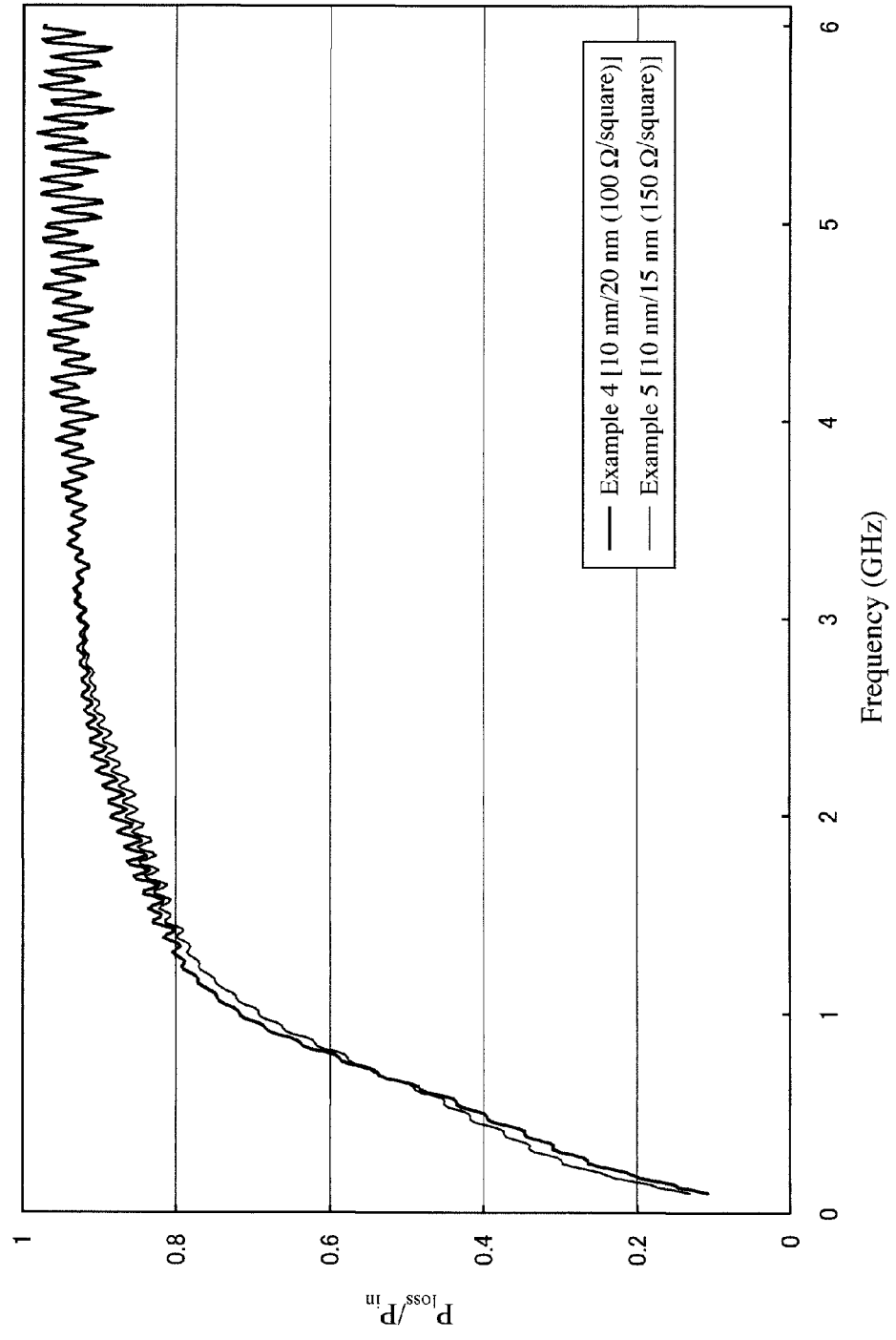
FIG. 18 is a graph showing the noise absorption ratios $P_{loss}/P_{in}$ of the near-field noise suppression sheets of Examples 4 and 5.
Figure 19:
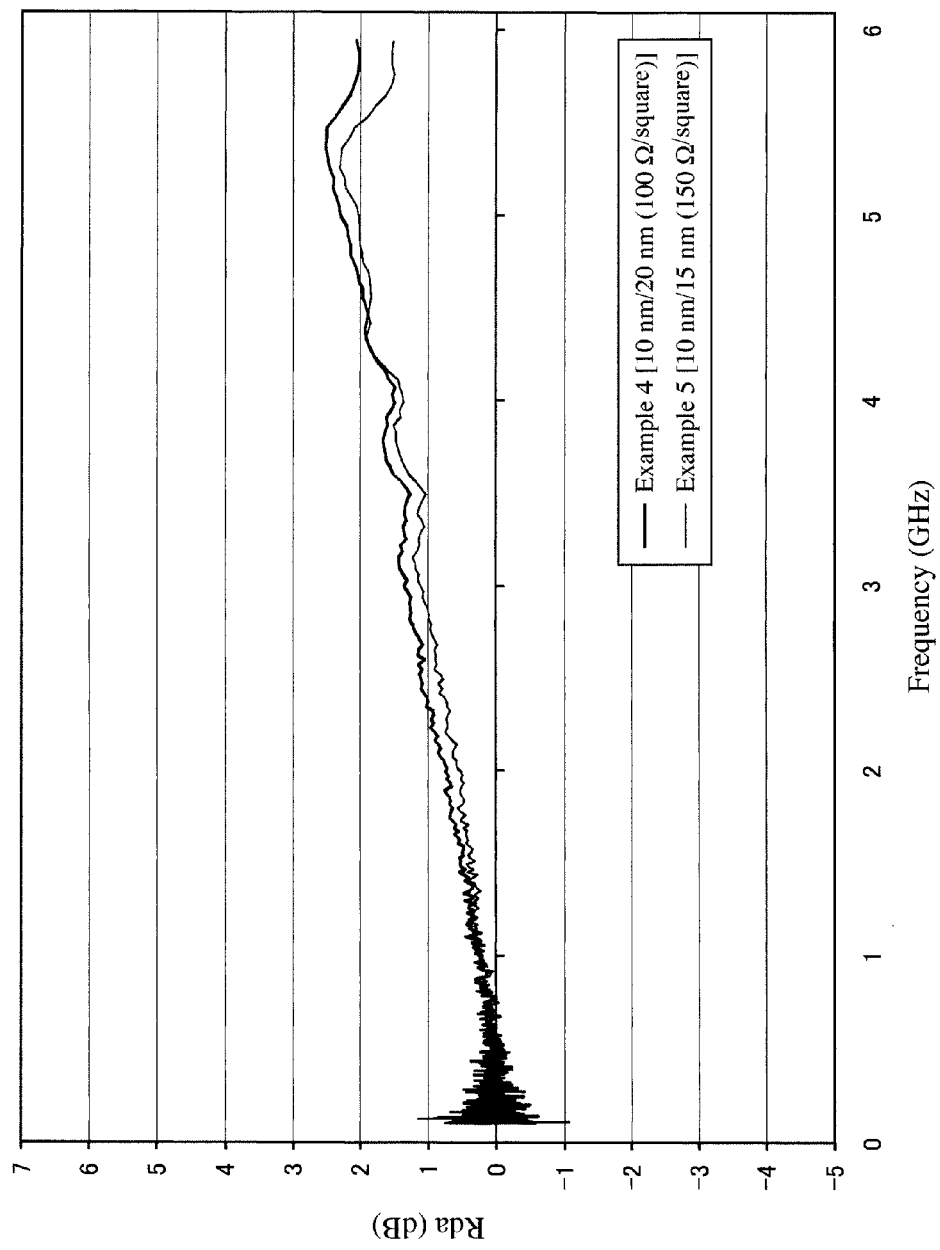
FIG. 19 is a graph showing the intra-decoupling ratios Rda of the near-field noise suppression sheets of Examples 4 and 5.
Figure 20:
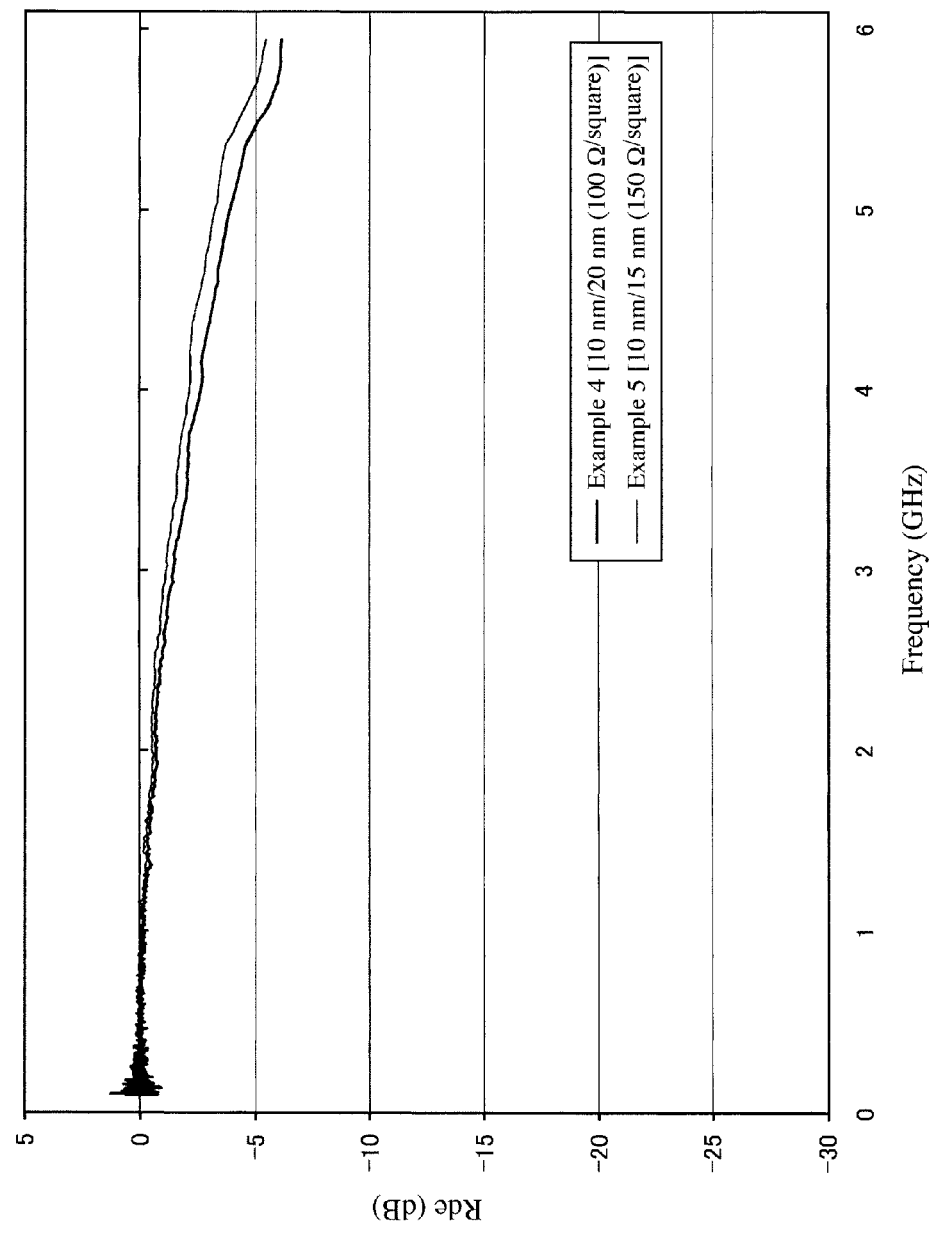
FIG. 20 is a graph showing the inter-decoupling ratios Rde of the near-field noise suppression sheets of Examples 4 and 5.

Their transmission attenuation ratios Rtp, noise absorption ratios $P_{loss}/P_{in}$, intra-decoupling ratios Rda and inter-decoupling ratios Rde were determined by the same method as in Example 1. The transmission attenuation ratios Rtp are shown in FIG. 17, the noise absorption ratios $P_{loss}/P_{in}$ are shown in FIG. 18, the intra-decoupling ratios Rda are shown in FIG. 19, and the inter-decoupling ratios Rde are shown in FIG. 20. As is clear from FIG. 17, any near-field noise suppression sheets of Examples 4 and 5 having surface resistance of 100 Ω/square and 150 Ω/square, respectively, had good transmission attenuation ratios Rtp, which are, however, poorer than those of the near-field noise suppression sheets of Examples 1-3 having surface resistance of 40-81 Ω/square. As is clear from FIGS. 18-20, any near-field noise suppression sheets of Examples 4 and 5 had as high noise absorption ratios $P_{loss}/P_{in}$ as 0.8 or more at frequencies over about 1 GHz, as well as good intra-decoupling ratios Rda and inter-decoupling ratios Rde. This indicates that the near-field noise suppression sheets of Examples 4 and 5 had excellent noise reduction capability in a wide frequency range including a low-frequency range of 1-3 GHz.

Example 6

Comparative Examples 3 and 4

A thin Ni film 1b having the thickness shown in Table 7 below was formed on a 16-µm-thick PET film 1a by a vacuum vapor deposition method, to obtain a first sheet 1. Likewise, a thin Ni film 2b having the thickness shown in Table 7 below was formed on a 16-µm-thick PET film 2a, to obtain a second sheet 2. The first and second sheets 1, 2 were adhered by the same conductive adhesive as in Example 1, with the thin Ni films 1b, 2b inside. Test pieces TP were cut out of arbitrary five portions of the resultant laminate sheet, a near-field noise suppression sheet. The surface resistance of each test piece TP was measured by the method shown in FIGS. 5(a) and 5(b). The range and average of surface resistance of each thin Ni film are shown in Table 7 together with its thickness. As is clear from Table 7, the surface resistance of Example 6 had small unevenness. The surface resistances of Comparative Examples 3 and 4 had substantially no unevenness, but they were as small as about 4 Ω/square, extremely poor in the capability of absorbing near-field noises as described below.

TABLE 7

| | Thickness of Thin Ni Film (nm) | | Surface Resistance (Ω/square) | |
|---|---|---|---|---|
| No. | First Sheet | Second Sheet | Range | Average |
| Example 6 | 30 | 30 | 22-26 | 24 |
| Com. Ex. 3 | 50 | — | — | 4.5 |
| Com. Ex. 4 | 30 | 50 | — | 4.1 |

Figure 21:
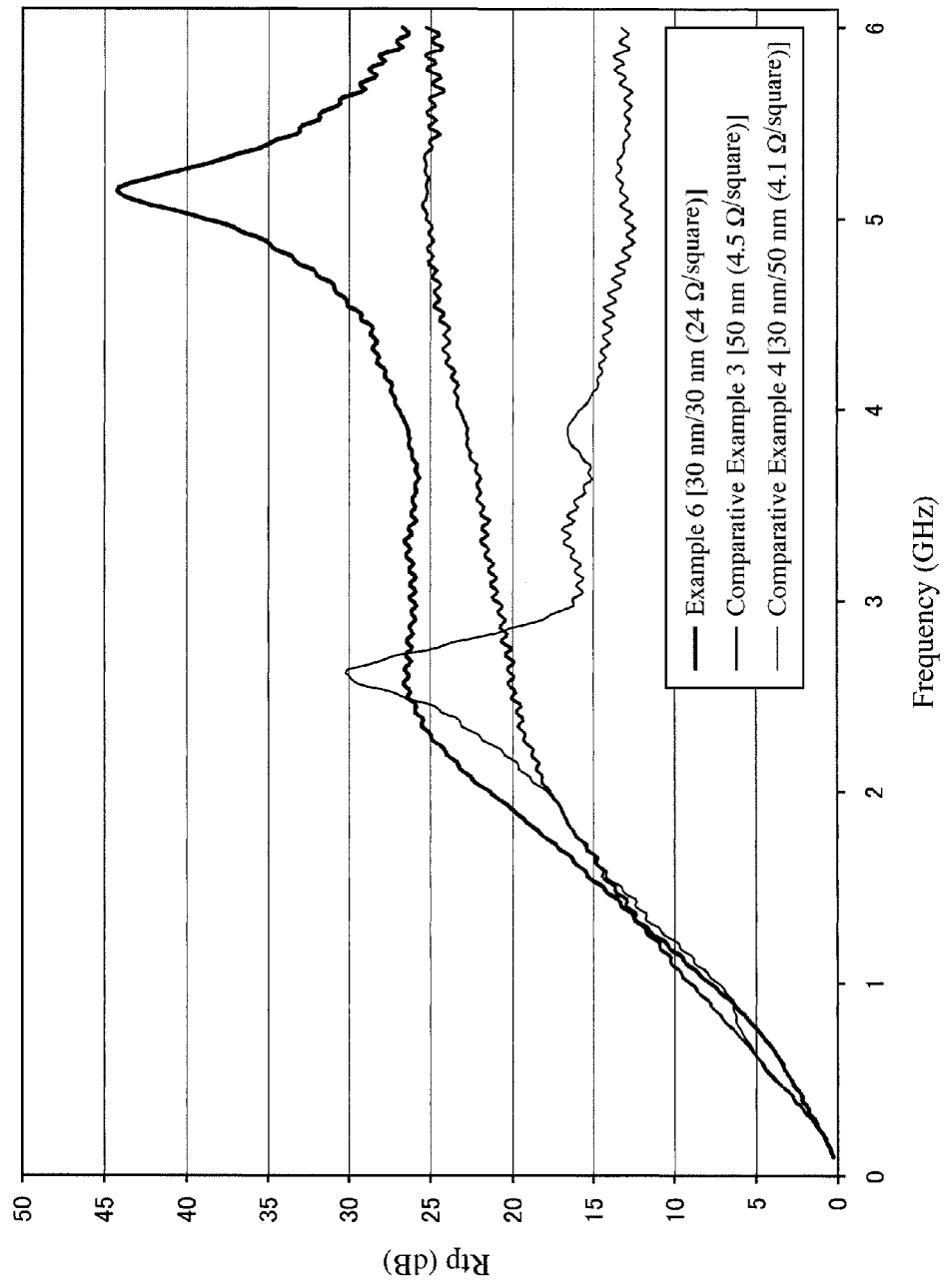
FIG. 21 is a graph showing the transmission attenuation ratios Ptp of the near-field noise suppression sheets of Example 6 and Comparative Examples 3 and 4.
Figure 22:
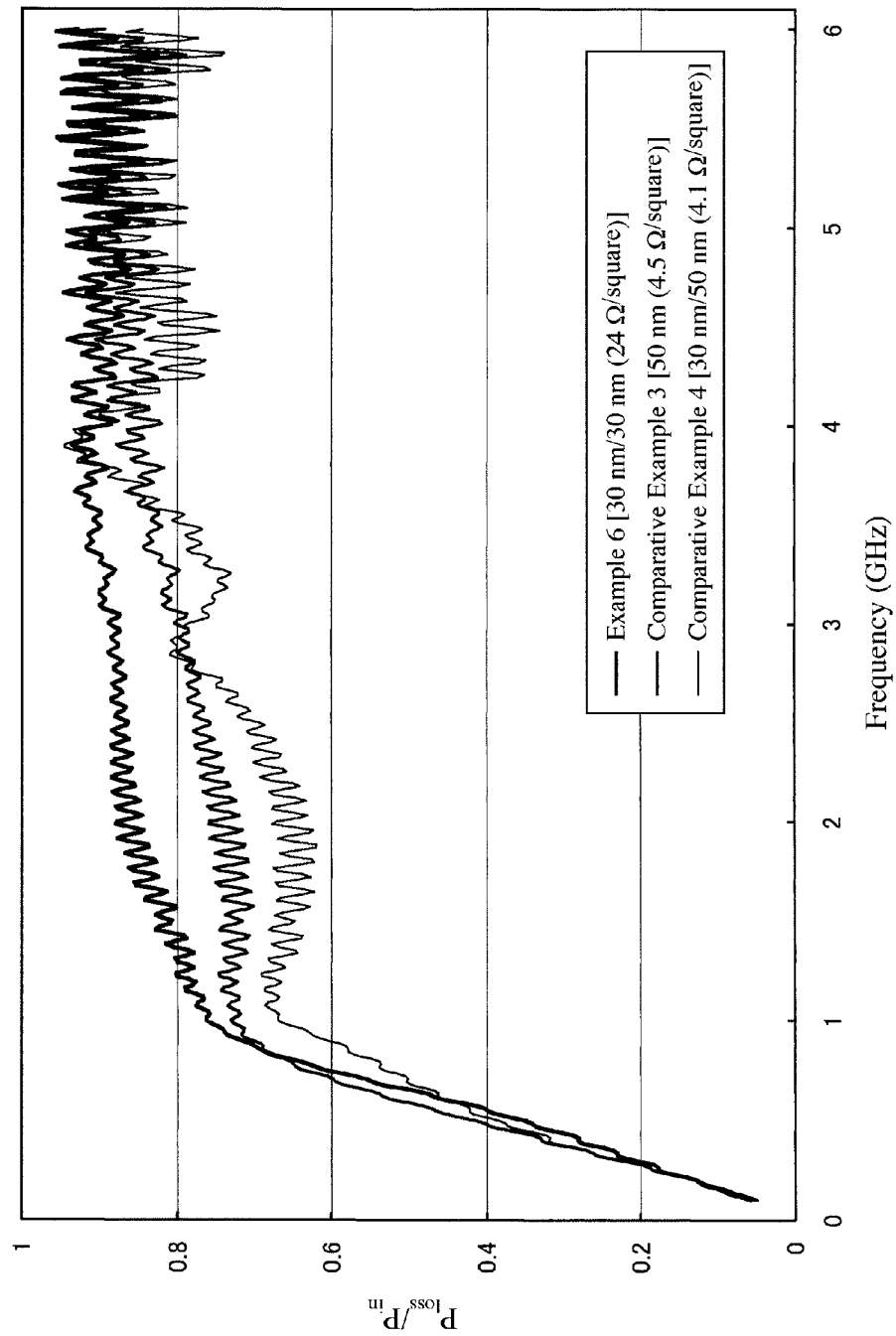
FIG. 22 is a graph showing the noise absorption ratios $P_{loss}/P_{in}$ of the near-field noise suppression sheets of Example 6 and Comparative Examples 3 and 4.
Figure 23:
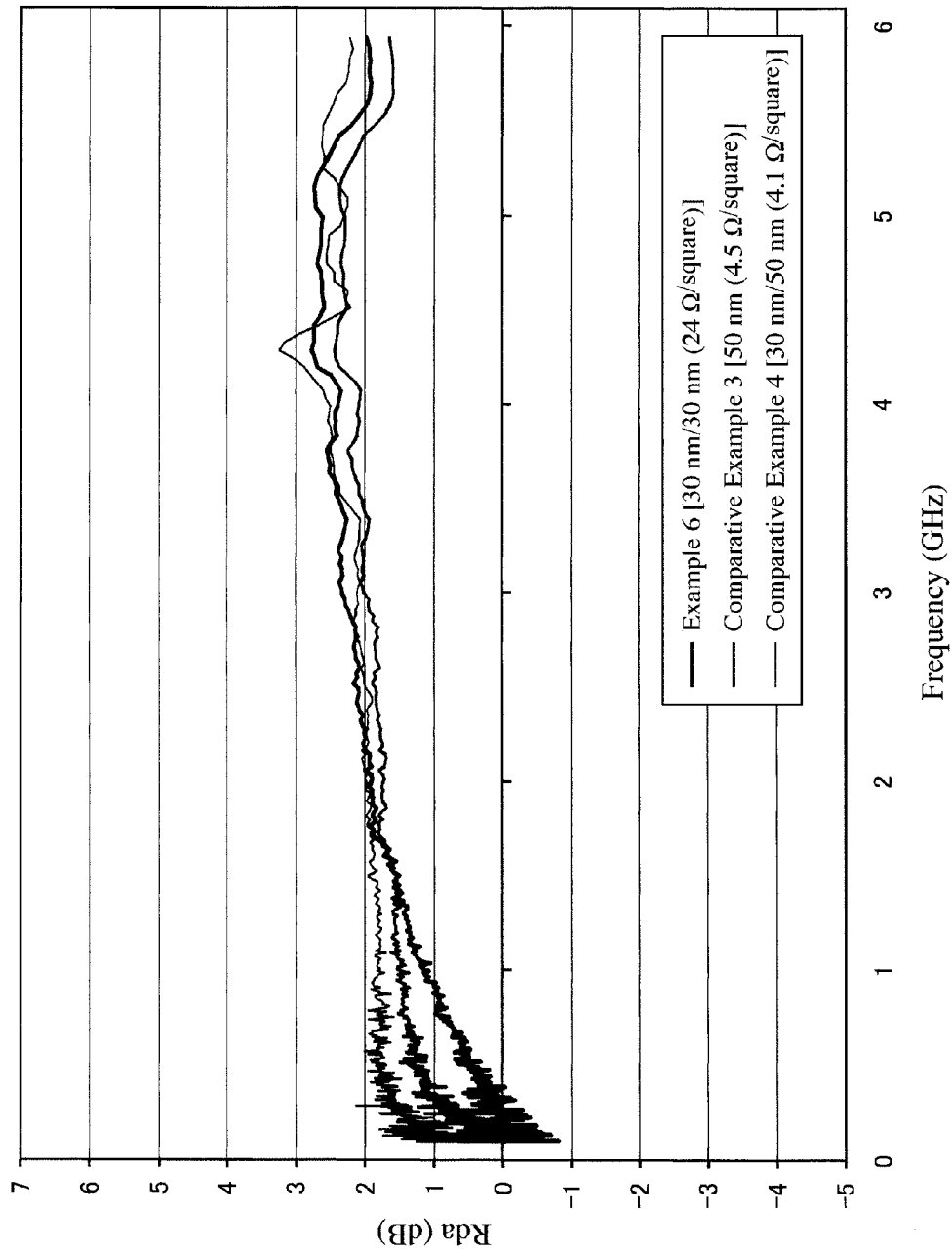
FIG. 23 is a graph showing the intra-decoupling ratios Rda of the near-field noise suppression sheets of Example 6 and Comparative Examples 3 and 4.
Figure 24:
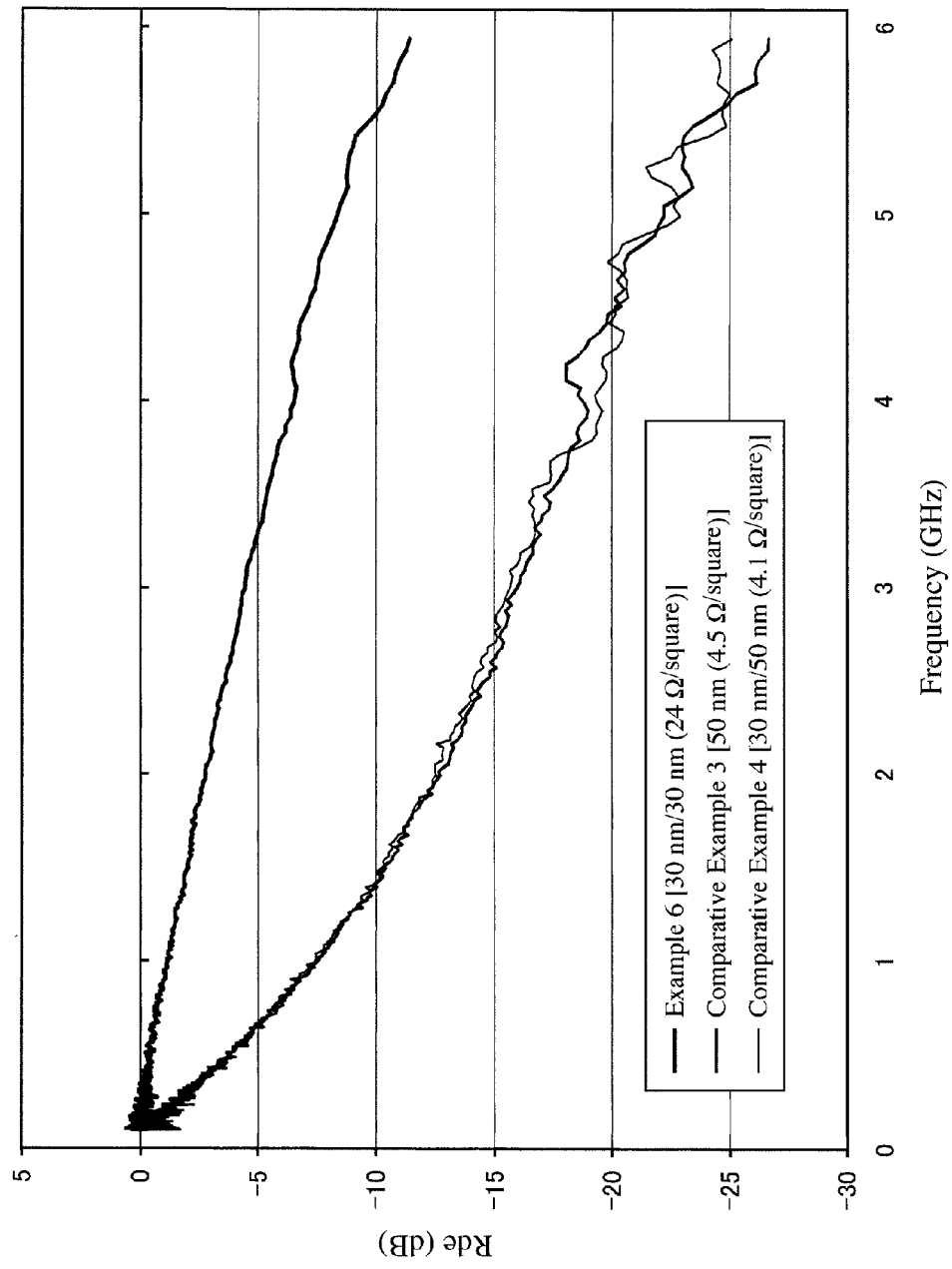
FIG. 24 is a graph showing the inter-decoupling ratios Rde of the near-field noise suppression sheets of Example 6 and Comparative Examples 3 and 4.

Their transmission attenuation ratios Rtp, noise absorption ratios $P_{loss}/P_{in}$, intra-decoupling ratios Rda and inter-decoupling ratios Rde were determined by the same method as in Example 1. The transmission attenuation ratios Rtp are shown in FIG. 21, the noise absorption ratios $P_{loss}/P_{in}$ are shown in FIG. 22, the intra-decoupling ratios Rda are shown in FIG. 23, and the inter-decoupling ratios Rde are shown in FIG. 24. As is clear from FIG. 21, the near-field noise suppression sheet of Example 6 having surface resistance of 24 Ω/square had a good transmission attenuation ratio Rtp, while the near-field noise suppression sheet of Comparative Example 3 having surface resistance of 4.5 Ω/square and the near-field noise suppression sheet of Comparative Example 4 having surface resistance of 4.1 Ω/square had poor transmission attenuation ratios Rtp. As is clear from FIG. 22, the near-field noise suppression sheet of Example 6 had a high noise absorption ratio $P_{loss}/P_{in}$ in a low-frequency range of 1-3 GHz, while the near-field noise suppression sheets of Comparative Examples 3 and 4 had low noise absorption ratios $P_{loss}/P_{in}$. Also, the near-field noise suppression sheets of Comparative Examples 3 and 4 were extremely poorer than that of Example 6 in an inter-decoupling ratio Rde. This indicates that with surface resistance of less than 20 Ω/square, any of transmission attenuation ratios Rtp, noise absorption ratios $P_{loss}/P_{in}$ and inter-decoupling ratios Rde are low.

Examples 7 and 8

A thin Ni film 1b having the thickness shown in Table 8 below was formed on a 16-µm-thick PET film 1a by a vacuum vapor deposition method, to obtain a first sheet 1. Likewise, a thin Ni film 2b having the thickness shown in Table 6 below was formed on a 16-µm-thick PET film 2a, to obtain a second sheet 2. The first and second sheets 1, 2 were adhered by the same conductive adhesive as in Example 1, with the thin Ni films 1b, 2b inside. Test pieces TP were cut out of arbitrary five portions of the resultant laminate sheet, a near-field noise suppression sheet. The surface resistance of each test piece TP was measured by the method shown in FIGS. 5(a) and 5(b). The range and average of surface resistance of each thin Ni film are shown in Table 8 together with its thickness. As is clear from Table 8, each Example had small unevenness in surface resistance.

TABLE 8

| | Thickness of Thin Ni Film (nm) | | Surface Resistance (Ω/square) | |
|---|---|---|---|---|
| No. | First Sheet | Second Sheet | Range | Average |
| Example 7 | 10 | 30 | 41-52 | 44 |
| Example 1 | 15 | 30 | 35-45 | 40 |
| Example 8 | 20 | 30 | 31-37 | 33 |

Figure 25:
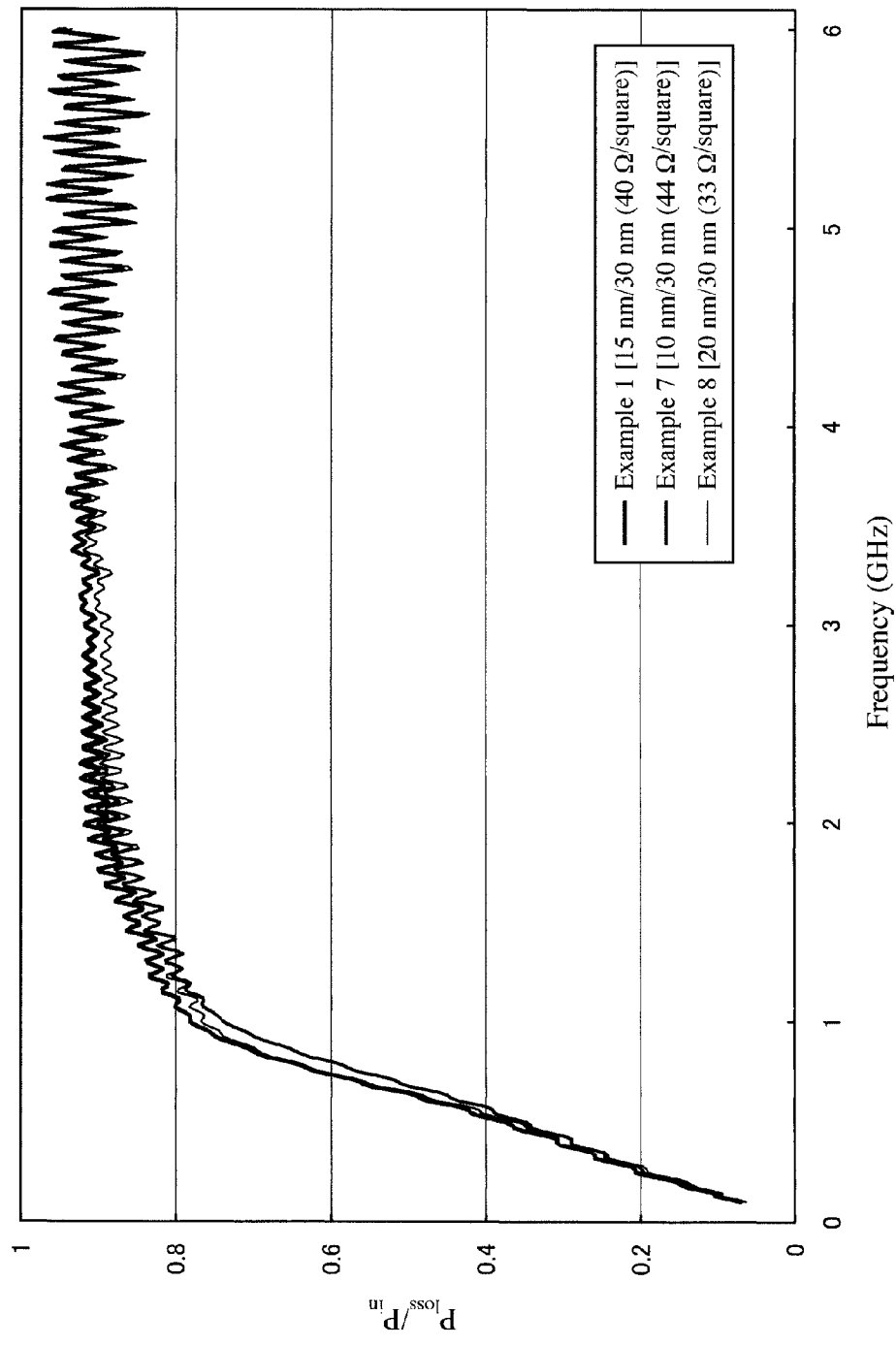
FIG. 25 is a graph showing the noise absorption ratios $P_{loss}/P_{in}$ of the near-field noise suppression sheets of Examples 1, 7 and 8.
Figure 26:
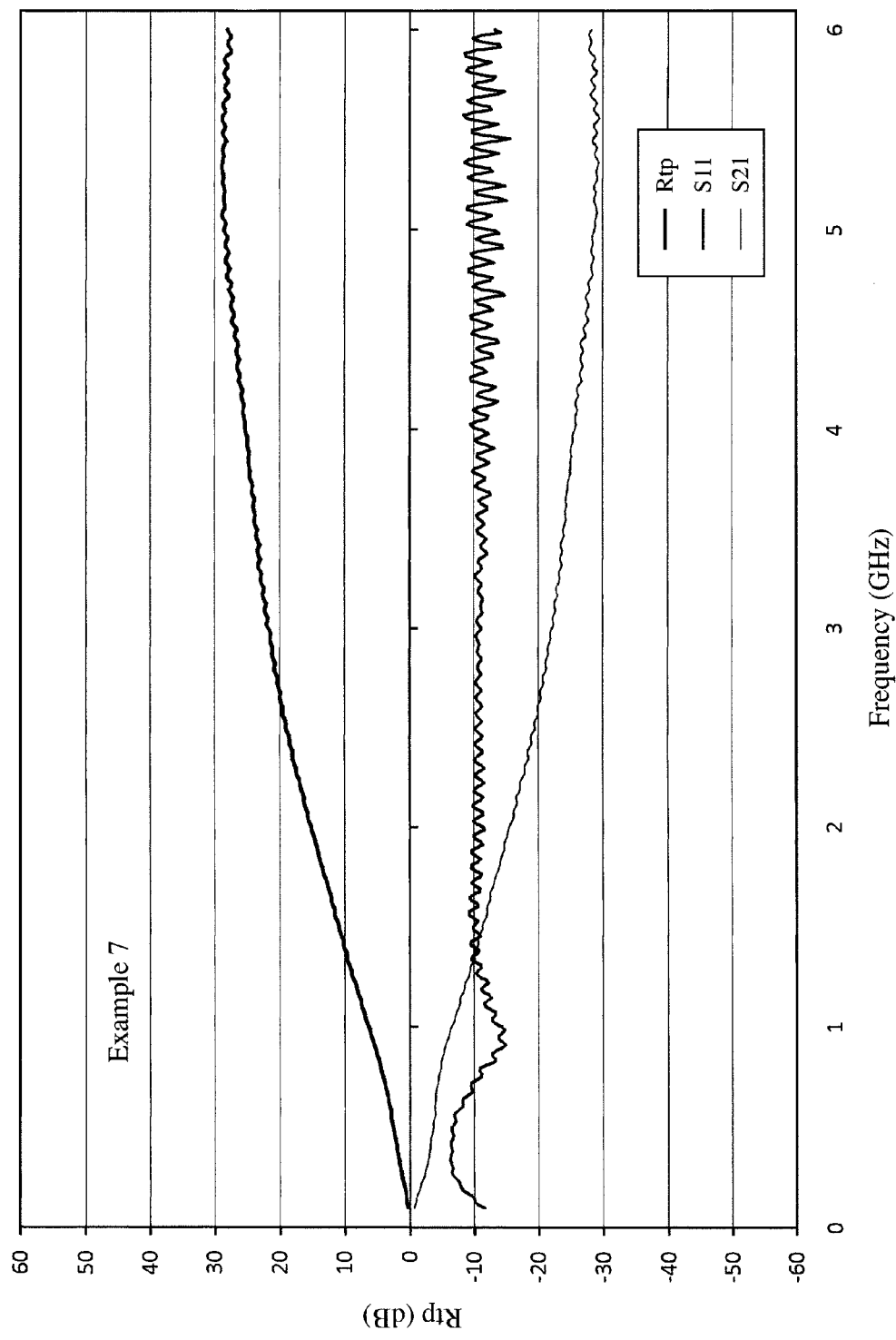
FIG. 26 is a graph showing the transmission attenuation ratio Ptp, $S_{11}$ and $S_{21}$ of the near-field noise suppression sheet of Example 7.
Figure 27:
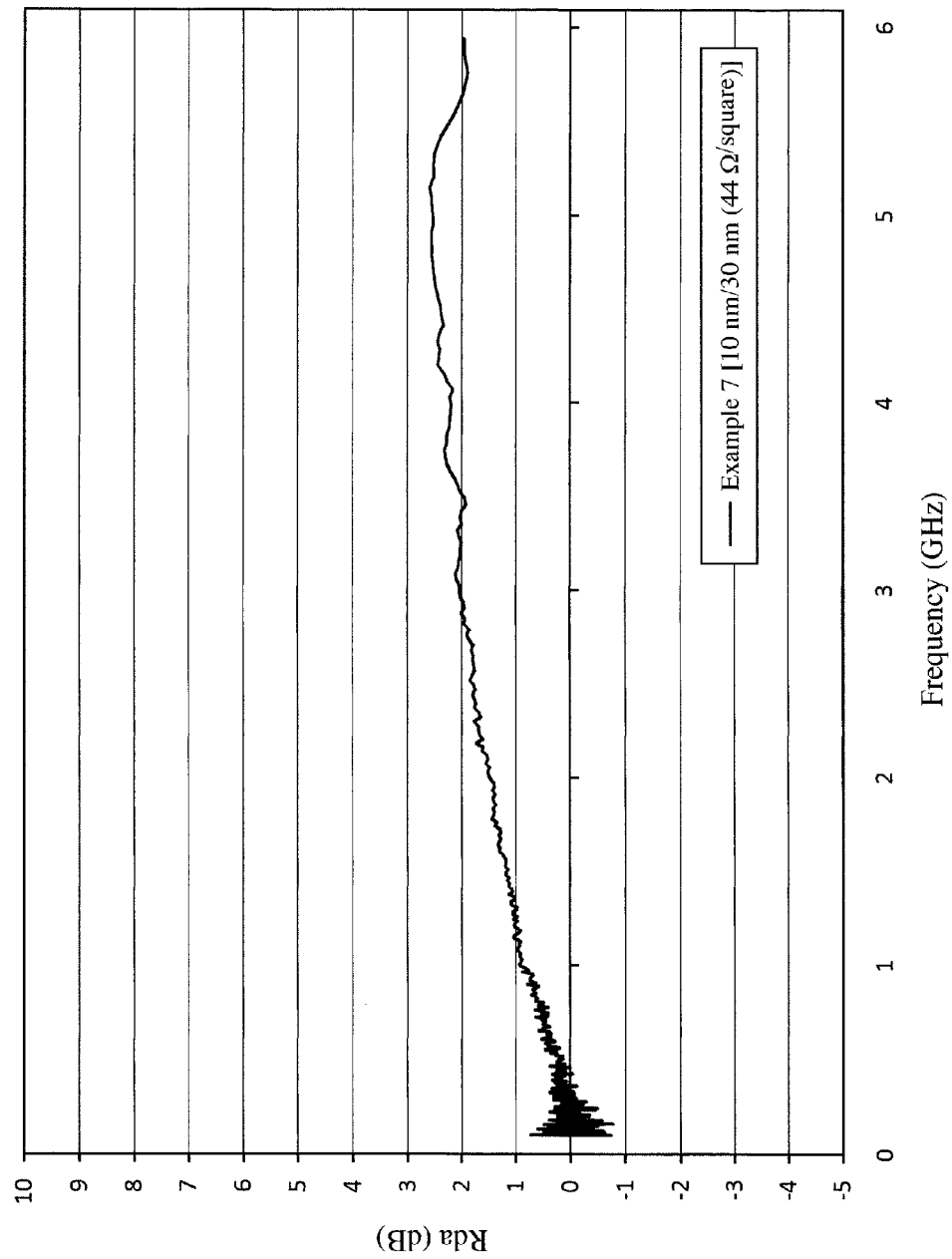
FIG. 27 is a graph showing the intra-decoupling ratio Rda of the near-field noise suppression sheet of Example 7.
Figure 28:
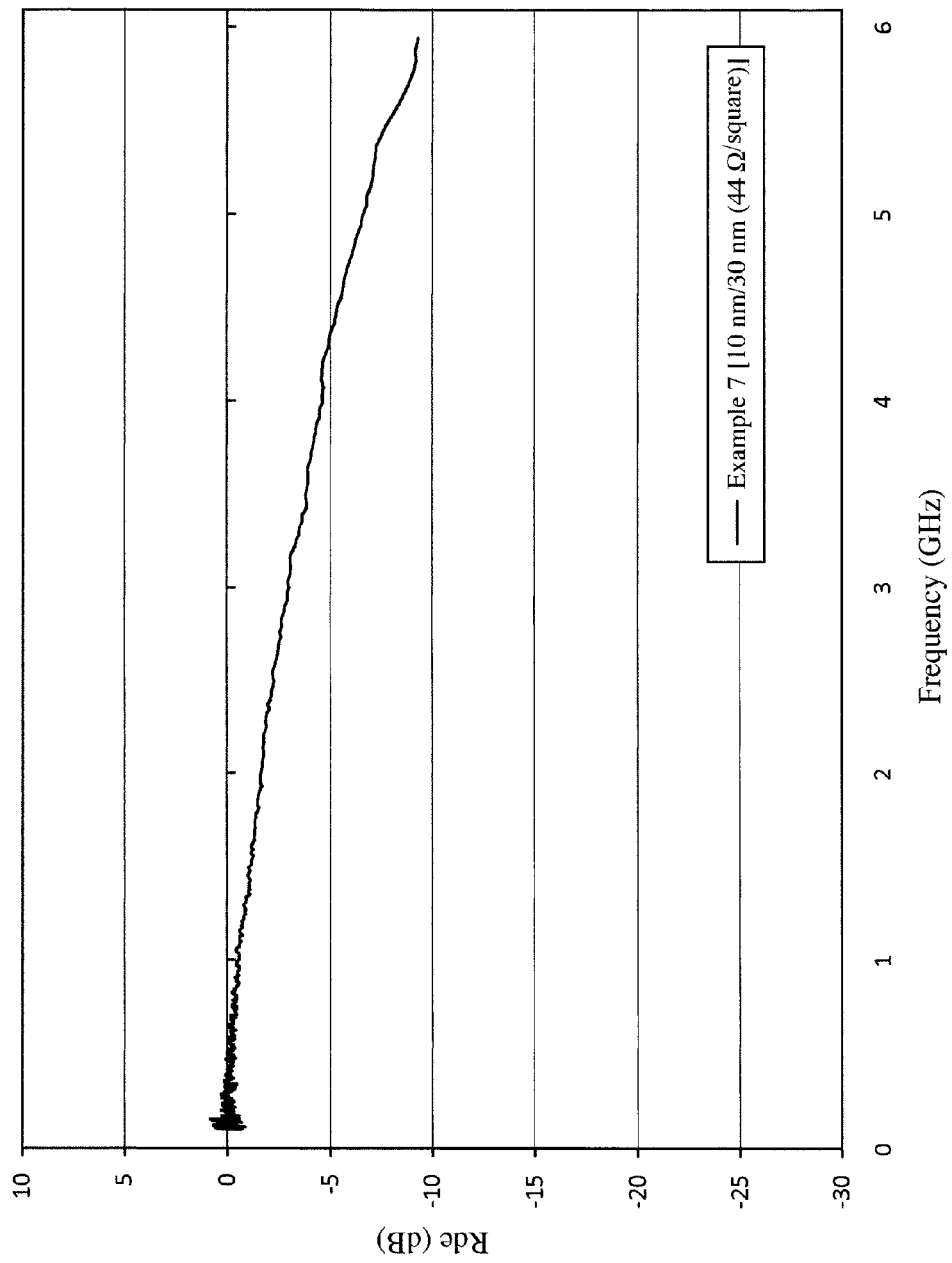
FIG. 28 is a graph showing the inter-decoupling ratio Rde of the near-field noise suppression sheet of Example 7.
Figure 29:
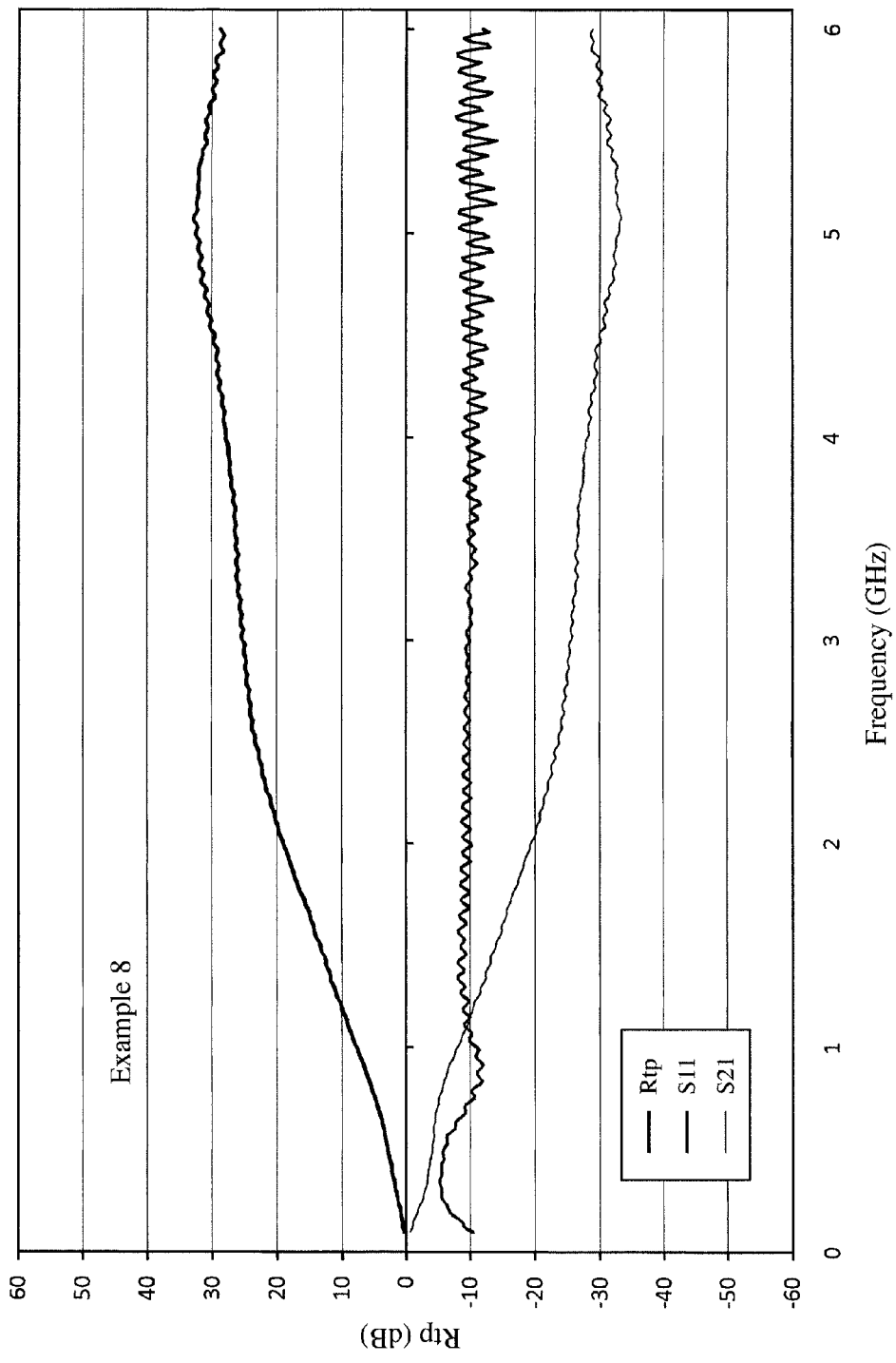
FIG. 29 is a graph showing the transmission attenuation ratio Ptp, $S_{11}$ and $S_{21}$ of the near-field noise suppression sheet of Example 8.
Figure 30:
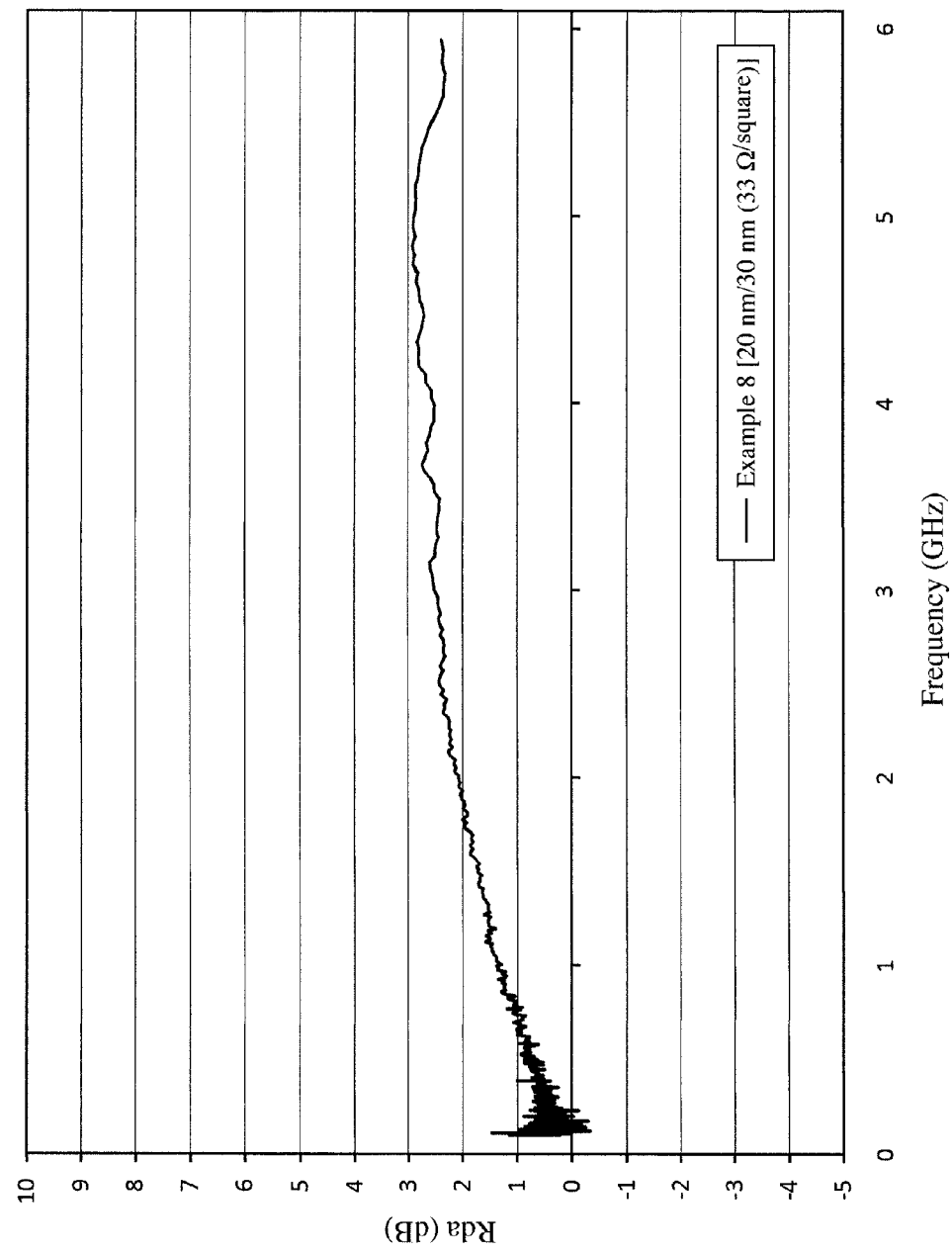
FIG. 30 is a graph showing the intra-decoupling ratio Rda of the near-field noise suppression sheet of Example 8.
Figure 31:
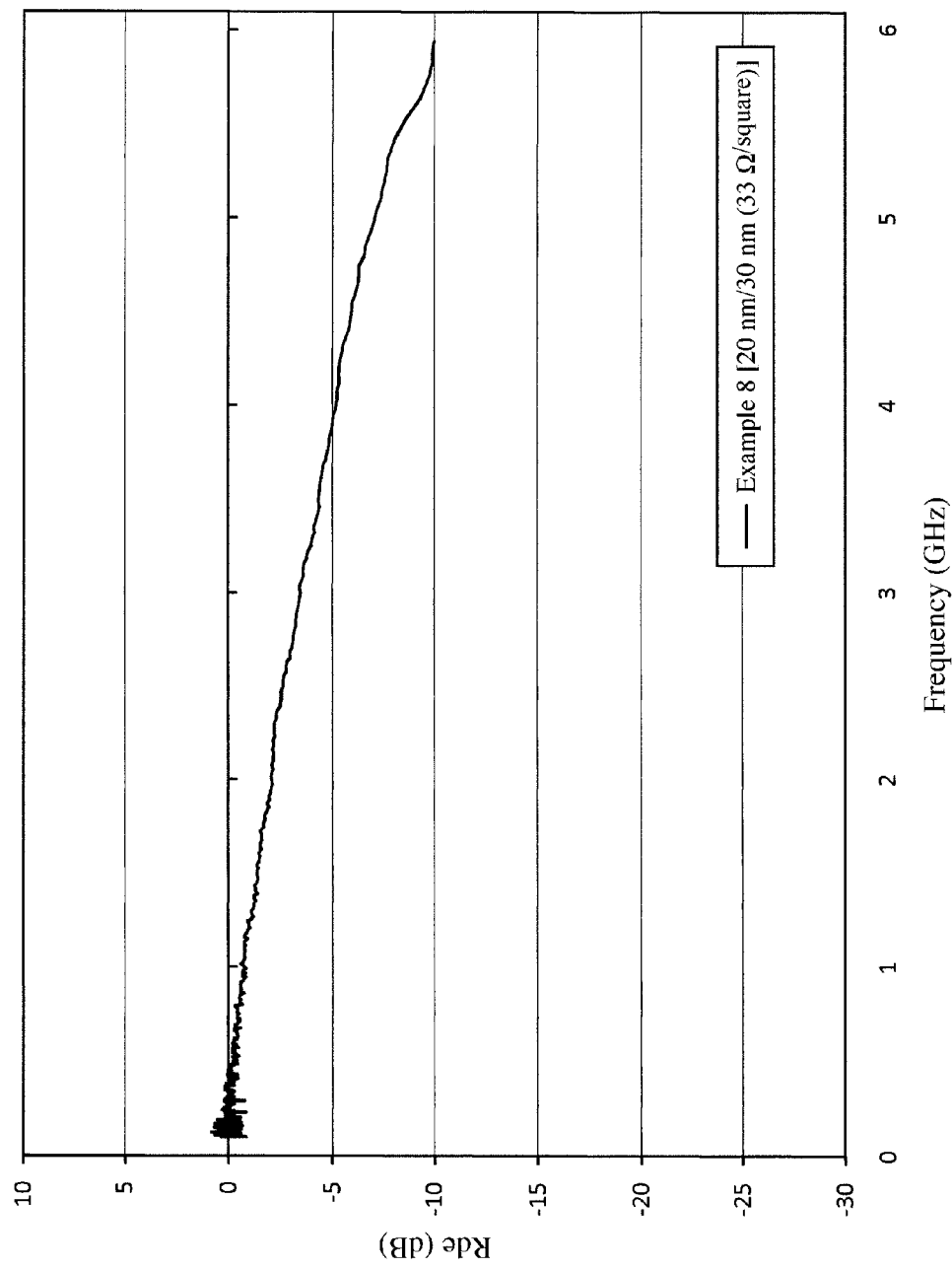
FIG. 31 is a graph showing the inter-decoupling ratio Rde of the near-field noise suppression sheet of Example 8.

The noise absorption ratios $P_{loss}/P_{in}$ determined by the same method as in Example 1 are shown in FIG. 25. The transmission attenuation ratio Rtp, intra-decoupling ratio Rda and inter-decoupling ratio Rde of Example 7 are shown in FIGS. 26-28, and the transmission attenuation ratio Rtp, intra-decoupling ratio Rda and inter-decoupling ratio Rde of Example 8 are shown in FIGS. 29-31. As is clear from FIG. 25, Examples 7 and 8 had as good noise absorption ratios $P_{loss}/P_{in}$ as that of Example 1, 0.8 or more at frequencies over about 1 GHz. Also, as is clear from FIGS. 26-31, any near-field noise suppression sheets of Examples 7 and 8 had good transmission attenuation ratios Rtp, intra-decoupling ratios Rda and inter-decoupling ratios Rde. This indicates that the near-field noise suppression sheets of Examples 7 and 8 having surface resistances of 44 Ω/square and 33 Ω/square, respectively, had excellent noise reduction capability in a wide frequency range including a low-frequency range of 1-3 GHz.

Comparative Examples 5-7

A thin Ni film 1b having the thickness shown in Table 9 below was formed on a 16-μm-thick PET film 1a by a vacuum vapor deposition method, to produce test pieces TP of the near-field noise suppression sheets of Comparative Examples 5 and 7 composed only of the first sheet 1. Also, a first sheet 1 provided with a thin Ni film 1b having the thickness shown in Table 10 below, which was formed on a 16-μm-thick PET film 1a by a vacuum vapor deposition method, and a second sheet 2 provided with a thin Ni film 2b having the thickness shown in Table 9 below, which was formed on a 16-μm-thick PET film 2a, were adhered by the same conductive adhesive as in Example 1, with the thin Ni films 1b, 2b inside, to produce a test piece TP of the near-field noise suppression sheet of Comparative Example 6. The surface resistance of each test piece TP was measured by the method shown in FIGS. 5(a) and 5(b). The results are shown in Table 9.

TABLE 9

| No. | Thickness of Thin Ni Film (nm) | | Surface Resistance (Ω/square) |
| --- | --- | --- | --- |
| | First Sheet | Second Sheet | |
| Com. Ex. 5 | 15 | — | 213 |
| Com. Ex. 6 | 10 | 10 | 250 |
| Com. Ex. 7 | 10 | — | 515 |

Figure 32:
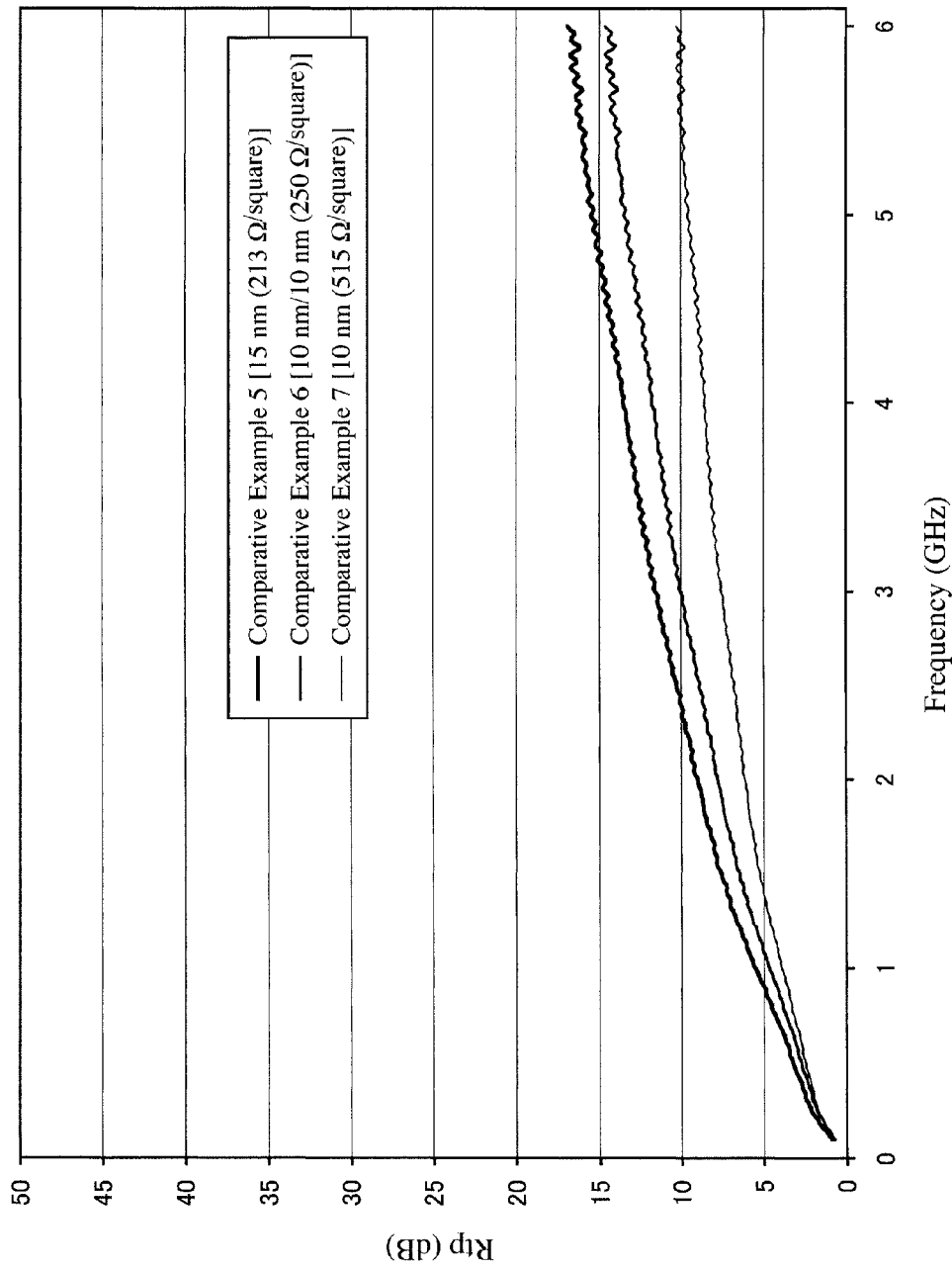
FIG. 32 is a graph showing the transmission attenuation ratios Ptp of the near-field noise suppression sheets of Comparative Examples 5-7.
Figure 33:
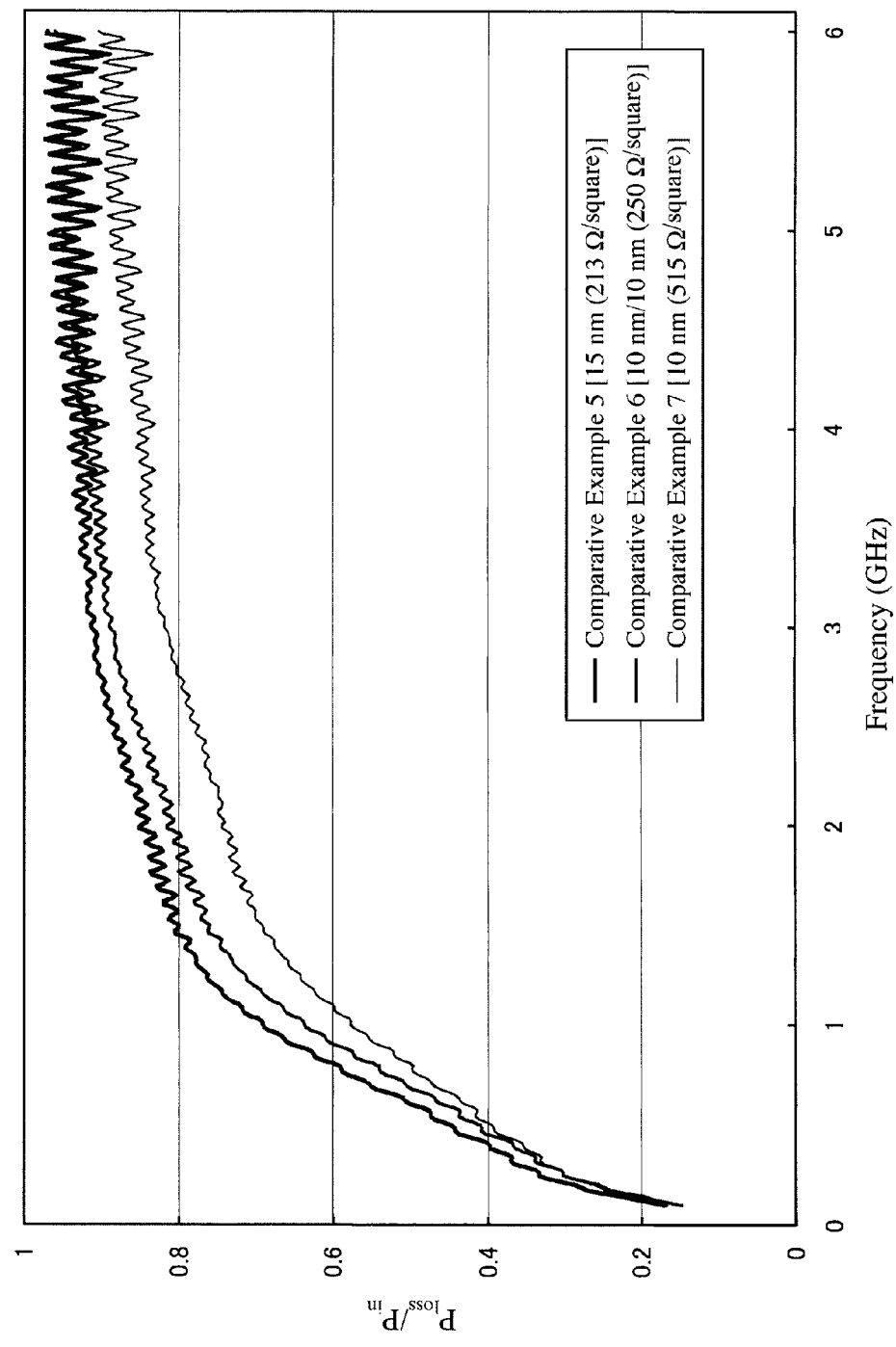
FIG. 33 is a graph showing the noise absorption ratios $P_{loss}/P_{in}$ of the near-field noise suppression sheets of Comparative Examples 5-7.
Figure 34:
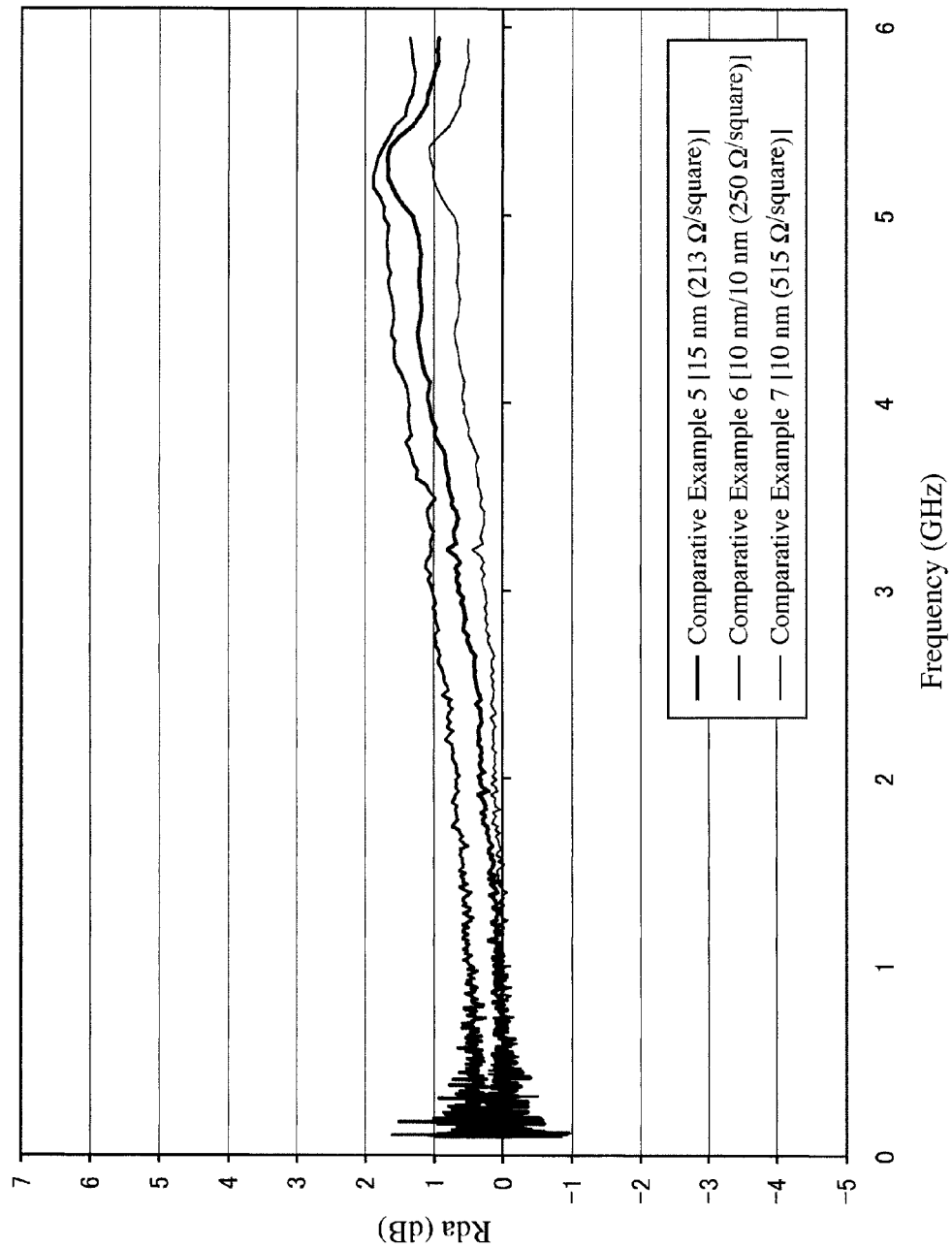
FIG. 34 is a graph showing the intra-decoupling ratios Rda of the near-field noise suppression sheets of Comparative Examples 5-7.
Figure 35:
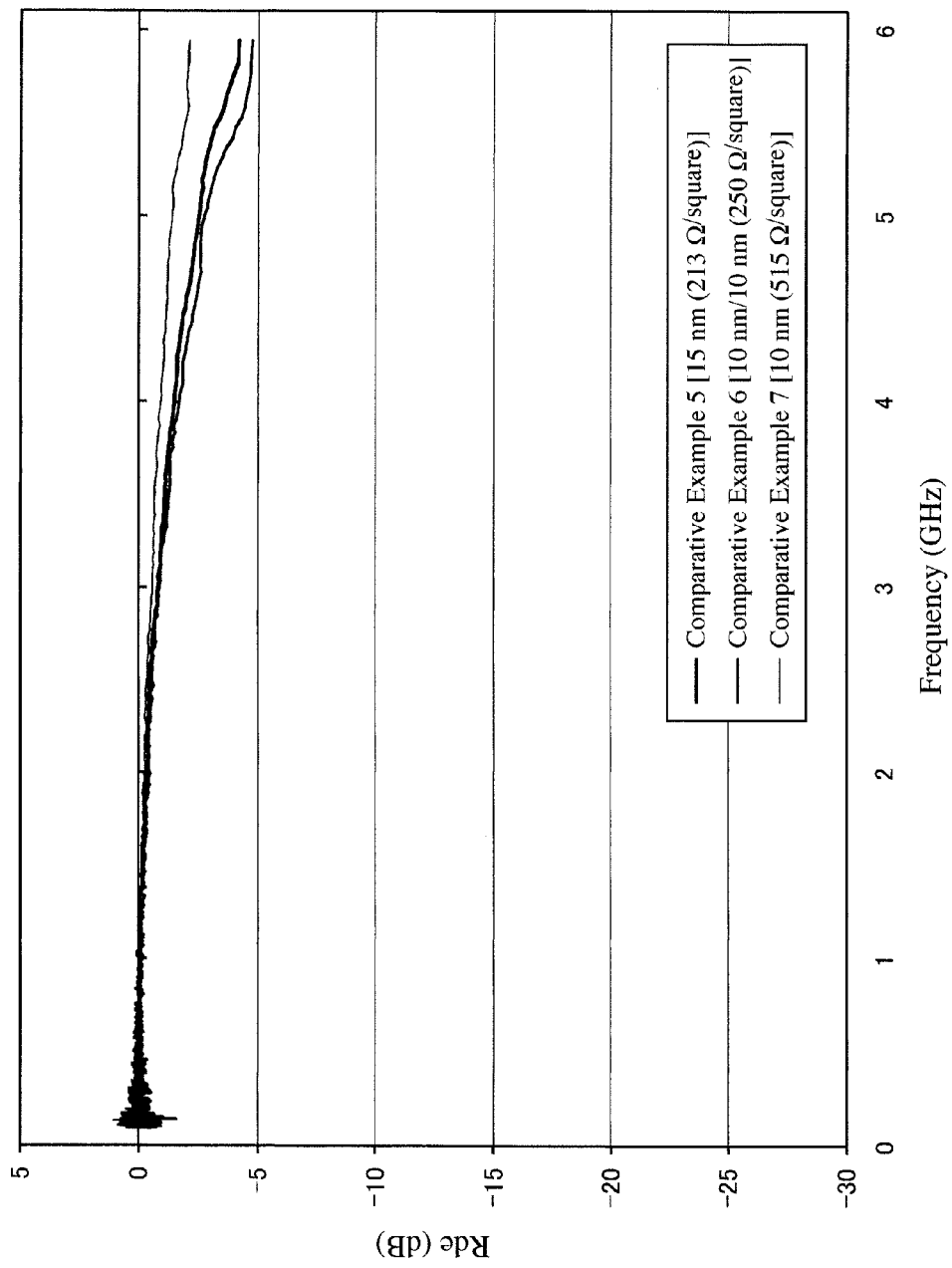
FIG. 35 is a graph showing the inter-decoupling ratios Rde of the near-field noise suppression sheets of Comparative Examples 5-7.

Their transmission attenuation ratios Rtp, noise absorption ratios $P_{loss}/P_{in}$, intra-decoupling ratios Rda and inter-decoupling ratios Rde were determined by the same method as in Example 1. The transmission attenuation ratios Rtp are shown in FIG. 32, the noise absorption ratios $P_{loss}/P_{in}$ are shown in FIG. 33, the intra-decoupling ratios Rda are shown in FIG. 34, and the inter-decoupling ratios Rde are shown in FIG. 35. As is clear from FIGS. 32 and 33, any near-field noise suppression sheets of Comparative Examples 5-7 had extremely low transmission attenuation ratios Rtp, and the noise absorption ratio $P_{loss}/P_{in}$ of Comparative Example 7 was also low. This indicates that the near-field noise suppression sheets of Comparative Examples 5-7 had poor transmission attenuation ratios Rtp and noise absorption ratios $P_{loss}/P_{in}$.

EFFECTS OF THE INVENTION

The near-field noise suppression sheet of the present invention having the above-described structure has high capability of absorbing near-field noises of several hundreds of MHz to several GHz, with extremely reduced unevenness in surface resistance despite extremely thin metal films, advantageously resulting in extremely small unevenness in electromagnetic wave absorbability among products. The near-field noise suppression sheet of the present invention having such feature effectively suppresses near-field noises in various mobile information terminals such as mobile phones, smartphones, etc., and electronic appliances such as personal computers, etc.

What is claimed is:

1. A near-field noise suppression sheet comprising a pair of plastic films each having a thin metal film on one surface, said plastic films being adhered by a conductive adhesive with said thin metal films inside, each thin metal film being made of a magnetic metal, and having a controlled thickness such that a pair of the adhered thin metal films have surface resistance of 20-150 Ω/square.

2. The near-field noise suppression sheet according to claim 1, wherein said magnetic metal is Ni, Fe, Co or an alloy thereof.

3. The near-field noise suppression sheet according to claim 1, wherein said thin metal film is made of Ni.

4. The near-field noise suppression sheet according to claim 1, wherein both thin metal films have thicknesses in a range of 10-30 nm.

5. The near-field noise suppression sheet according to claim 1, wherein a pair of the adhered thin metal films have surface resistance of 30-80 Ω/square.

6. The near-field noise suppression sheet according to claim 1, wherein said thin metal film is formed by a vacuum vapor deposition method.

* * * * *